(12) United States Patent
Chikama et al.

(10) Patent No.: US 9,595,544 B2
(45) Date of Patent: Mar. 14, 2017

(54) THIN FILM TRANSISTOR SUBSTRATE AND DISPLAY DEVICE

(71) Applicant: Sharp Kabushiki Kaisha, Osaka-shi, Osaka (JP)

(72) Inventors: Yoshimasa Chikama, Osaka (JP); Yukinobu Nakata, Osaka (JP); Tetsuya Yamashita, Osaka (JP); Jun Nishimura, Osaka (JP)

(73) Assignee: Sharp Kabushiki Kiasha, Sakai (JP)

( * ) Notice: Subject to any disclaimer, the term of this patent is extended or adjusted under 35 U.S.C. 154(b) by 0 days.

(21) Appl. No.: 14/422,807

(22) PCT Filed: Aug. 22, 2013

(86) PCT No.: PCT/JP2013/072378
§ 371 (c)(1),
(2) Date: Feb. 20, 2015

(87) PCT Pub. No.: WO2014/034512
PCT Pub. Date: Mar. 6, 2014

(65) Prior Publication Data
US 2015/0214255 A1    Jul. 30, 2015

(30) Foreign Application Priority Data
Aug. 30, 2012    (JP) ................................ 2012-190647

(51) Int. Cl.
*H01L 27/12*    (2006.01)
*H01L 29/24*    (2006.01)
(Continued)

(52) U.S. Cl.
CPC ........ *H01L 27/1248* (2013.01); *G02F 1/1362* (2013.01); *G02F 1/133345* (2013.01);
(Continued)

(58) Field of Classification Search
CPC ................................................. H01L 29/66765
See application file for complete search history.

(56) References Cited

U.S. PATENT DOCUMENTS

| 2007/0042597 A1 | 2/2007 | Yamazaki |
| 2010/0134710 A1 | 6/2010 | Ishitani et al. |

(Continued)

FOREIGN PATENT DOCUMENTS

| JP | 02-105556 A | 4/1990 |
| JP | 2003-218110 A | 7/2003 |

(Continued)

OTHER PUBLICATIONS

Official Communication issued in International Patent Application No. PCT/JP2013/072378, mailed on Oct. 1, 2013.

*Primary Examiner* — Alexander Ghyka
(74) *Attorney, Agent, or Firm* — Keating & Bennett, LLP

(57) ABSTRACT

The present invention provides a thin film transistor substrate and a display device that prevent peeling. The thin film transistor substrate includes: an insulating substrate; a thin film transistor; a first inorganic insulating layer; an organic insulating layer stacked on the first inorganic insulating layer; and a second inorganic insulating layer stacked on the organic insulating layer. The organic insulating layer includes a side covered with the second inorganic insulating layer. The first inorganic insulating layer may contain silicon oxide. The organic insulating layer may contain photosensitive resin. The second inorganic insulating layer may contain silicon nitride.

10 Claims, 18 Drawing Sheets

(51) Int. Cl.
- *H01L 29/66* (2006.01)
- *H01L 21/02* (2006.01)
- *G02F 1/1333* (2006.01)
- *G02F 1/1362* (2006.01)
- *H01L 29/786* (2006.01)

(52) U.S. Cl.
CPC .... *H01L 21/02107* (2013.01); *H01L 27/1225* (2013.01); *H01L 27/1244* (2013.01); *H01L 29/24* (2013.01); *H01L 29/66765* (2013.01); *H01L 29/7869* (2013.01); *H01L 29/78606* (2013.01)

(56) References Cited

U.S. PATENT DOCUMENTS

| | | |
|---|---|---|
| 2012/0242923 A1 | 9/2012 | Miyamoto et al. |
| 2013/0176516 A1 | 7/2013 | Ishitani et al. |

FOREIGN PATENT DOCUMENTS

| | | |
|---|---|---|
| JP | 2005-159329 A | 6/2005 |
| JP | 2010-156960 A | 7/2010 |
| WO | 2011/104791 A1 | 9/2011 |

(a)

(b)

(c)

(a)

(b)

(c)

(a)

(b)

(c)

(a)

(b)

(c)

(a)

(b)

(c)

(a)

39  38  37  40

(b)

(c)

45

(a)

(b)

(c)

(a)

(b)

(c)

(a)

(b)

(c)

(a)

(b)

(c)

THIN FILM TRANSISTOR SUBSTRATE AND DISPLAY DEVICE

TECHNICAL FIELD

The present invention relates to a thin film transistor substrate and a display device. More specifically, the present invention relates to a thin film transistor substrate suitable to include an organic insulating layer, and a display device including the thin film transistor substrate.

BACKGROUND ART

Thin film transistor substrates (hereinafter, also referred to as array substrates) typically include a thin film transistor (TFT) as a switching element in each pixel that is a minimum unit of an image.

An array substrate typically includes, in addition to TFTs, various wires, insulating layers for insulating these wires, and terminals for connecting other electronic components. A semiconductor integrated circuit and a flexible printed circuit substrate (hereinafter, also referred to as an FPC substrate) may be connected to (mounted on) the array substrate with an anisotropic conductive member such as an anisotropic conductive film (ACF).

Some techniques for forming an insulating layer with an organic material have been proposed. An example is an active matrix substrate that includes a gate electrode, a gate insulating layer covering the gate electrodes, an oxide semiconductor layer that is disposed on the gate insulating layer and includes a channel region, an interlayer insulating film covering source and drain electrodes on the oxide semiconductor layer, and a flattening film disposed on the interlayer insulating film. The flattening film is provided with an aperture connected to the interlayer insulating film in an upper part of the channel region (e.g. Patent Literature 1).

Another example is a liquid crystal display device that includes a thin film transistor including an oxide semiconductor layer. This liquid crystal display device includes a chromatic color translucent resin layer as an interlayer film that covers at least the oxide semiconductor layer (e.g. Patent Literature 2).

CITATION LIST

Patent Literature

Patent Literature 1: WO 2011/104791
Patent Literature 2: JP 2010-156960 A

SUMMARY OF INVENTION

Technical Problem

When a liquid crystal display panel of Comparative Embodiment 1, which was produced by the inventors of the present invention, was aged under high temperatures and high humidity conditions, the ACF discolored near terminals in some cases. This panel included an array substrate in which an insulating layer formed of an organic material (hereinafter, also referred to as an organic insulating layer) is stacked on an insulating layer formed of an inorganic material (hereinafter, also referred to as an inorganic insulating layer). Further observation of this panel revealed that the array substrate was partially peeled around the discolored part. This peeling was found at the interface between the inorganic insulating layer and the organic insulating layer. On the other hand, the terminals and wires that were made of copper (Cu) and disposed in the vicinity of the discolored part did not discolor (were not eroded).

FIG. 30 is a schematic cross-sectional view of the array substrate in the liquid crystal display panel of Comparative Embodiment 1, illustrating the periphery of a terminal.

As illustrated in FIG. 30, the array substrate of Comparative Embodiment 1 in the periphery of a terminal (not shown) included a glass substrate 130, wires 143 on the glass substrate 130, an inorganic insulating layer 131 covering the wires 143, an inorganic insulating layer 132 on the inorganic insulating layer 131, a protective layer 133 on the inorganic insulating layer 132, an inorganic insulating layer 134 on the protective layer 133, an organic insulating layer 135 on the inorganic insulating layer 134, transparent conductive layers 144 on the organic insulating layer 135, and an inorganic insulating layer 136 on the transparent conductive layers 144. The inorganic insulating layers 131 and 136 were formed of silicon nitride (SiNx), the organic insulating layer 135 was formed of photosensitive acrylic resin, and the transparent conductive layers 144 were formed of indium tin oxide (ITO). The semiconductor layers of TFTs (not shown) were formed of an oxide semiconductor. The inorganic insulating layers 132 and 134 and the protective layer 133 were formed of silicon dioxide ($SiO_2$) in order to reduce the oxygen loss of the oxide semiconductor.

In the array substrate of Comparative Embodiment 1, the sides of the organic insulating layer 135 are exposed. Moisture thus presumably enters from the exposed sides to cause the aforementioned peeling. Inorganic insulating films formed of silicon oxide have poorer adhesion with organic insulating films than inorganic insulating films formed of silicon nitride (SiNx). The liquid crystal display panel of Comparative Embodiment 1 thus presumably promotes the peeling.

The present invention has been made in view of the above situation and aims to provide a thin film transistor substrate and a display device that prevent peeling.

Solution to Problem

One aspect of the present invention may be a thin film transistor substrate including:
an insulating substrate;
a thin film transistor;
a first inorganic insulating layer;
an organic insulating layer stacked on the first inorganic insulating layer; and
a second inorganic insulating layer stacked on the organic insulating layer,
wherein the organic insulating layer may include a side covered with the second inorganic insulating layer.

Hereinafter, this thin film transistor substrate is also referred to as the thin film transistor substrate of the present invention.

Preferred embodiments of the thin film transistor substrate of the present invention are described below. The following preferred embodiments may be employed in appropriate combination, and a combination of two or more of the embodiments is also a preferred embodiment.

The thin film transistor substrate of the present invention may further include:
a display region in which multiple pixel regions are arranged; and
a peripheral region surrounding the display region,
wherein the side of the organic insulating layer may be placed in the peripheral region.

The thin film transistor substrate of the present invention may further include a terminal on the insulating substrate, wherein the side of the organic insulating layer may be placed in a periphery of the terminal.

The side of the organic insulating layer may be placed in a periphery of an end face of the thin film transistor substrate.

The first inorganic insulating layer may have a side under the side of the organic insulating layer, the second inorganic insulating layer may cover the side of the organic insulating layer and the side of the first inorganic insulating layer, and the second inorganic insulating layer may be in contact with the insulating substrate.

The thin film transistor substrate of the present invention may further include a third inorganic insulating layer between the insulating substrate and the first inorganic insulating layer, the first inorganic insulating layer may have a side under the side of the organic insulating layer, the second inorganic insulating layer may cover the side of the organic insulating layer and the side of the first inorganic insulating layer, the third inorganic insulating layer may have a part protruding from the first inorganic insulating layer, the second inorganic insulating layer may be in contact with an upper face of the part protruding from the first inorganic insulating layer, and the third inorganic insulating layer may contain silicon nitride.

The thin film transistor substrate of the present invention may further include a display region in which multiple pixel regions are arranged, wherein the side of the organic insulating layer may be placed in the display region.

The thin film transistor substrate of the present invention may further include:

a first transparent conductive layer; and a second transparent conductive layer, wherein the thin film transistor includes a drain electrode, the first inorganic insulating layer may be stacked on the drain electrode, the first transparent conductive layer may be stacked on the organic insulating layer, the second transparent conductive layer may be stacked on the second inorganic insulating layer, the organic insulating layer may be provided with an aperture, the side of the organic insulating layer may surround the aperture, the first and second inorganic insulating layers each may be provided with an aperture in the aperture of the organic insulating layer, and the second transparent conductive layer may be connected to the drain electrode through the apertures of the first and second inorganic insulating layers.

The first inorganic insulating layer may have a side under the side of the organic insulating layer, and the second inorganic insulating layer may cover the side of the organic insulating layer and the side of the first inorganic insulating layer.

The first inorganic insulating layer may have a part protruding from the organic insulating layer, and the second inorganic insulating layer may be in contact with an upper face of the part protruding from the organic insulating layer.

The first inorganic insulating layer may contain silicon oxide, and the organic insulating layer may contain photosensitive resin.

The second inorganic insulating layer may contain silicon nitride.

The thin film transistor may further include a semiconductor layer containing a metal oxide, and the metal oxide may contain oxygen and at least one element selected from the group consisting of indium, gallium, aluminum, copper, zinc, magnesium, and cadmium.

The metal oxide may contain indium, gallium, zinc, and oxygen.

Another aspect of the present invention may be a display device including the thin film transistor substrate of the present invention.

Advantageous Effects of Invention

The present invention provides a thin film transistor substrate and a display device that prevent peeling.

BRIEF DESCRIPTION OF DRAWINGS

FIG. 4(a) illustrates a TFT portion; FIG. 4(b) illustrates the periphery of a terminal; and FIG. 4(c) illustrates the periphery of an end face of the array substrate.

FIG. 5(a) illustrates a TFT portion; FIG. 5(b) illustrates the periphery of a terminal; and FIG. 5(c) illustrates the periphery of an end face of the array substrate.

FIG. 6(a) illustrates a TFT portion; FIG. 6(b) illustrates the periphery of a terminal; and FIG. 6(c) illustrates the periphery of an end face of the array substrate.

FIG. 7(a) illustrates a TFT portion; FIG. 7(b) illustrates the periphery of a terminal; and FIG. 7(c) illustrates the periphery of an end face of the array substrate.

FIG. 8(a) illustrates a TFT portion; FIG. 8(b) illustrates the periphery of a terminal; and FIG. 8(c) illustrates the periphery of an end face of the array substrate.

FIG. 9(a) illustrates a TFT portion; FIG. 9(b) illustrates the periphery of a terminal; and FIG. 9(c) illustrates the periphery of an end face of the array substrate.

FIG. 10(a) illustrates a TFT portion; FIG. 10(b) illustrates the periphery of a terminal; and FIG. 10(c) illustrates the periphery of an end face of the array substrate.

FIG. 11(a) illustrates a TFT portion; FIG. 11(b) illustrates the periphery of a terminal; and FIG. 11(c) illustrates the periphery of an end face of the array substrate.

FIG. 12(a) illustrates a TFT portion; FIG. 12(b) illustrates the periphery of a terminal; and FIG. 12(c) illustrates the periphery of an end face of the array substrate.

FIG. 13(a) illustrates a TFT portion; FIG. 13(b) illustrates the periphery of a terminal; and FIG. 13(c) illustrates the periphery of an end face of the array substrate.

DESCRIPTION OF EMBODIMENTS

Figure 1:
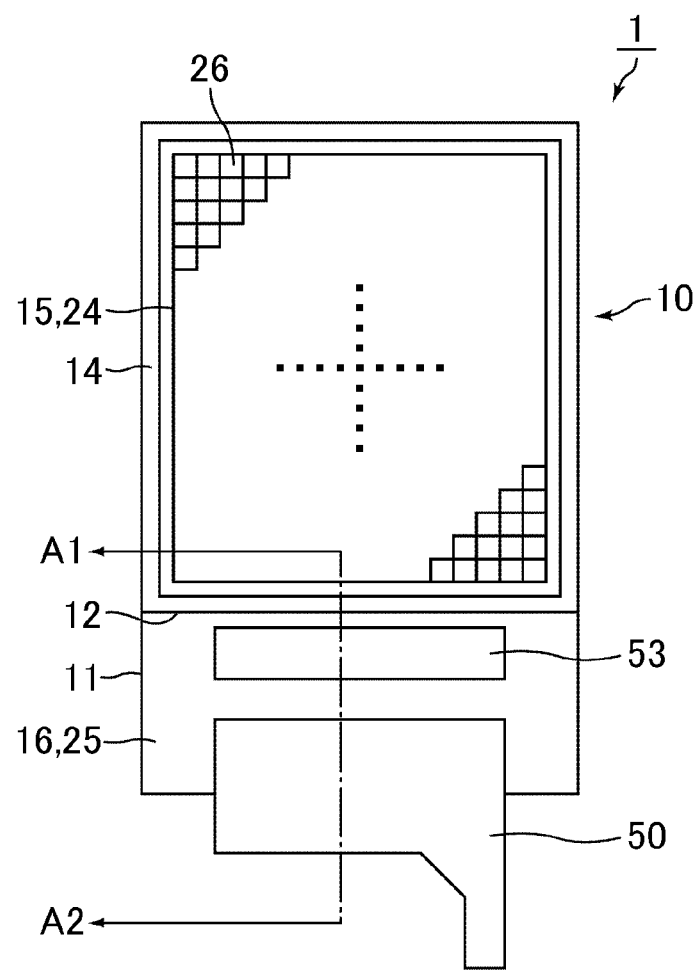
FIG. 1 is a schematic plan view of the liquid crystal display of Embodiment 1, on which an IC chip and an FPC substrate are disposed.

The present invention will be mentioned in more detail referring to the drawings in the following embodiments, but is not limited to these embodiments.

(Embodiment 1)

Figure 2:
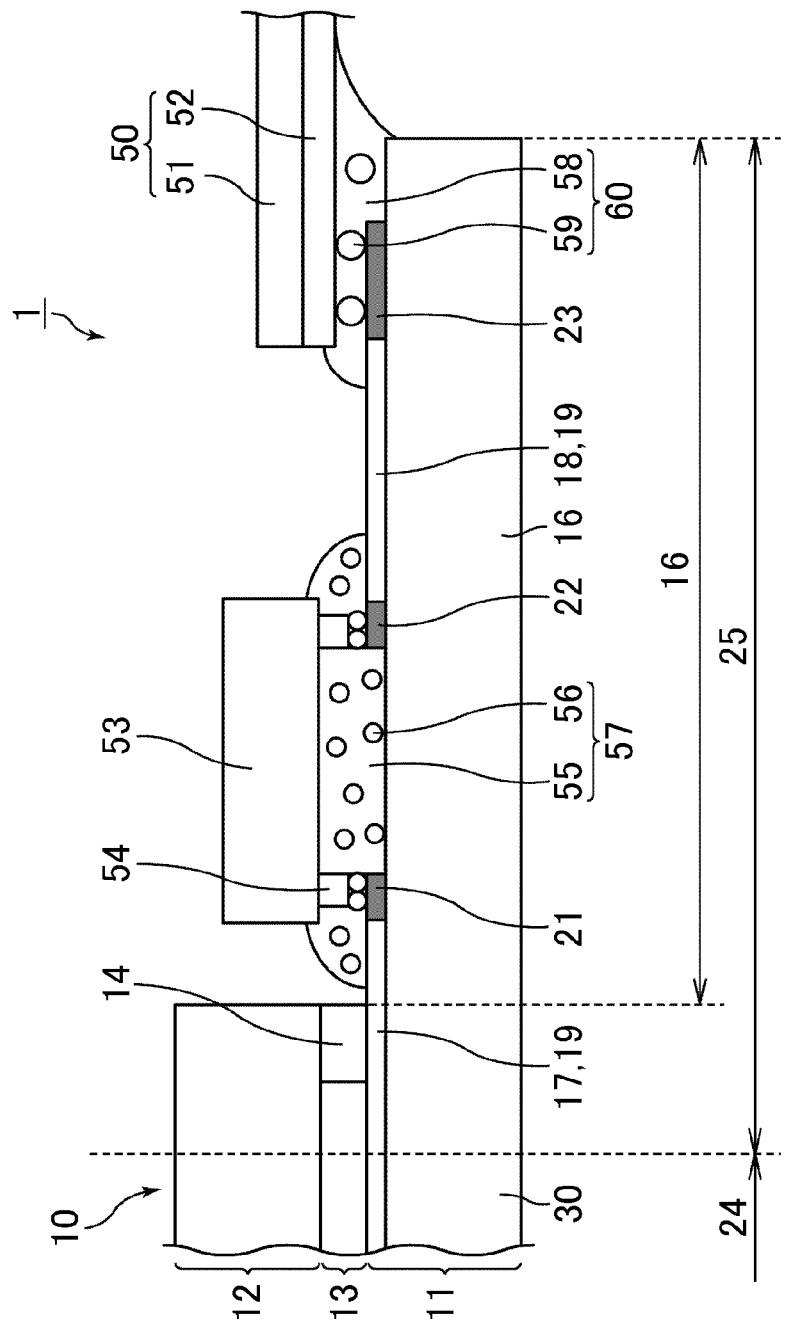
FIG. 2 is a schematic cross-sectional view taken along the line A1-A2 in FIG. 1.
Figure 3:
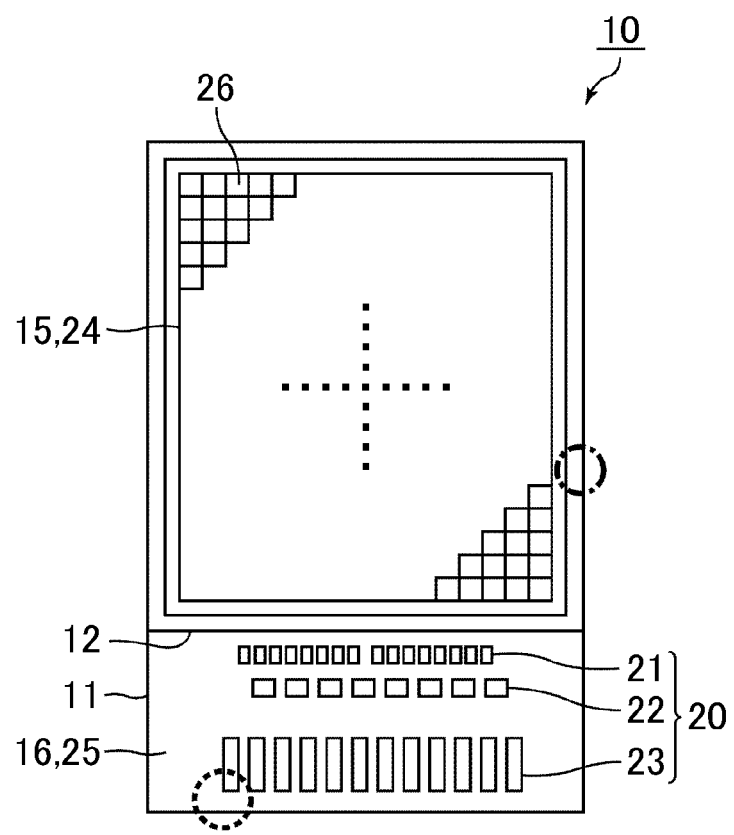
FIG. 3 is a schematic plan view of the liquid crystal display of each of Embodiments 1 to 3 on which an IC chip and an FPC substrate are not disposed.
Figure 4:
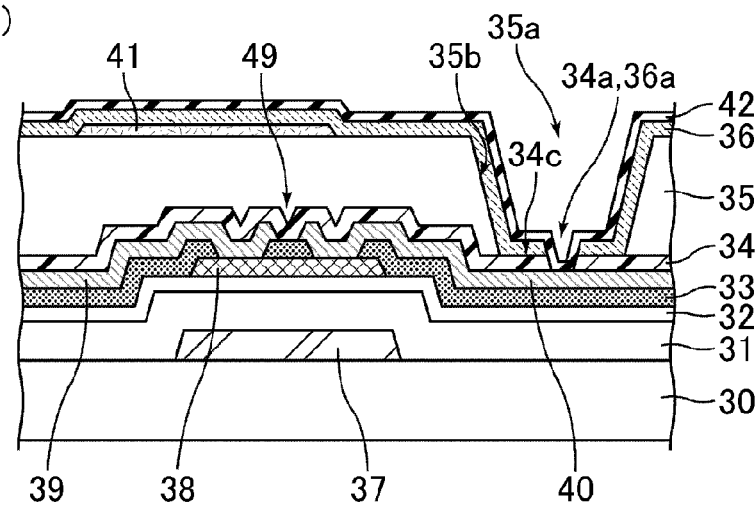
FIGS. 4(a) to 4(c) are schematic cross-sectional views of the array substrate of Embodiment 1.
Figure 4:
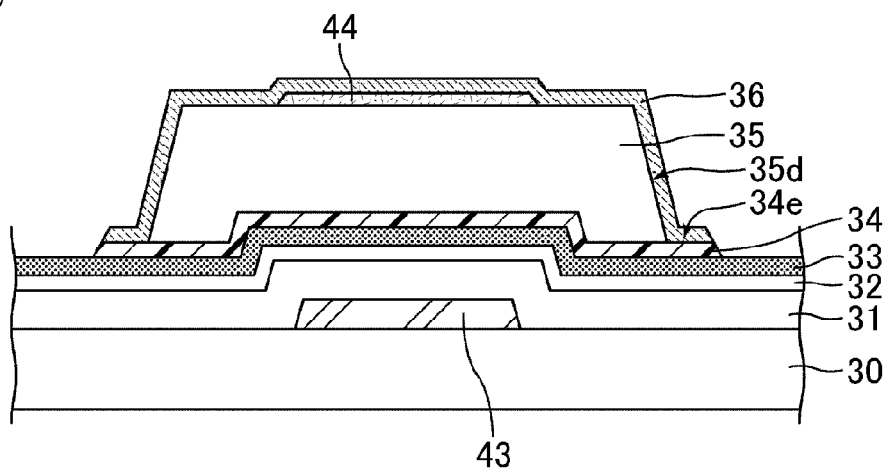
Figure 4:
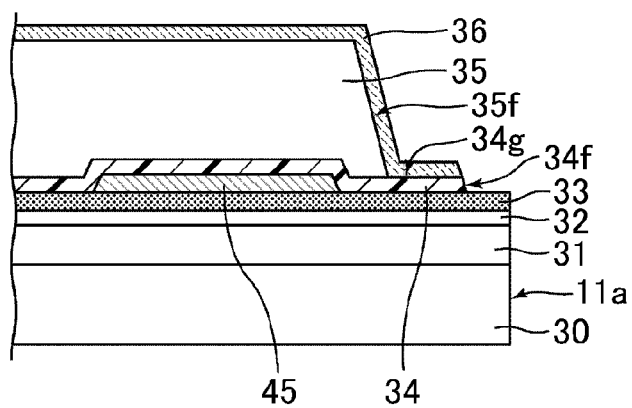
Figure 5:
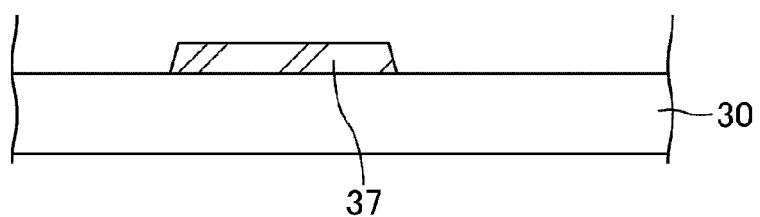
FIGS. 5(a) to 5(c) are schematic cross-sectional views of members in the production process (production step of a gate layer) of the array substrate of Embodiment 1.
Figure 5:
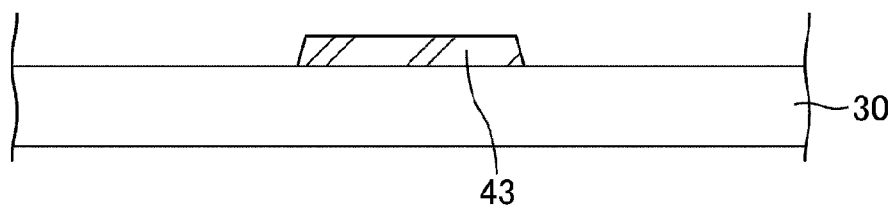
Figure 5:
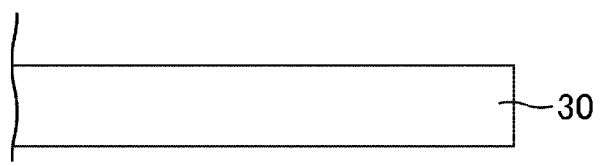
Figure 6:
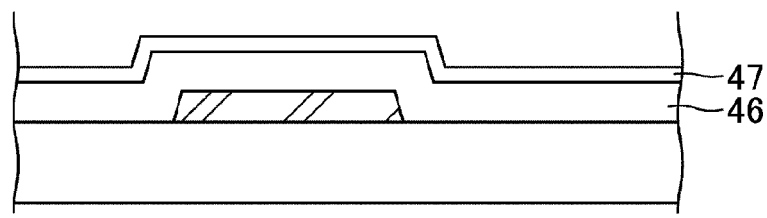
FIGS. 6(a) to 6(c) are schematic cross-sectional views of members in the production process (film production step of first and second insulating films) of the array substrate of Embodiment 1.
Figure 6:
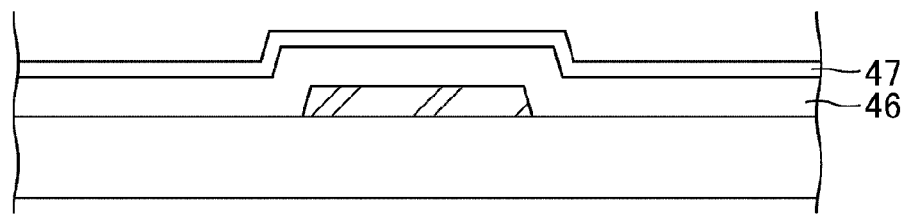
Figure 6:
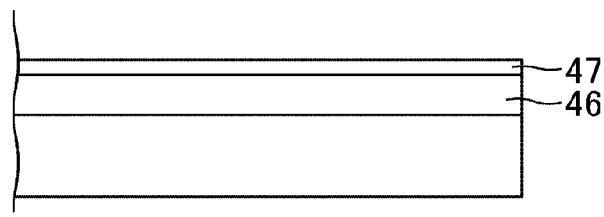

The liquid crystal display of Embodiment 1 is described referring to FIGS. 1 to 13. First, the entire structure of the liquid crystal display of Embodiment 1 is described referring to FIGS. 1 to 3. FIG. 1 is a schematic plan view of the liquid crystal display of Embodiment 1, on which an IC chip and an FPC substrate are disposed. FIG. 2 is a schematic cross-sectional view taken along the line A1-A2 in FIG. 1. FIG. 3 is a schematic plan view of the liquid crystal display of any one of Embodiments 1 to 3 on which an IC chip and an FPC substrate are not disposed.

A liquid crystal display 1 of the present embodiment is a transmissive liquid crystal display of active matrix drive mode and is of fringe field switching (FFS) mode, which is a kind of horizontal alignment mode. As illustrated in FIGS. 1 and 2, the liquid crystal display 1 includes a liquid crystal panel 10; a backlight (not shown); an IC chip 53 and a flexible wiring substrate (FPC substrate) 50 each mounted on the liquid crystal panel 10; an anisotropic conductive member 57 disposed between the liquid crystal panel 10 and the IC chip 53; and an anisotropic conductive member 60 disposed between the liquid crystal panel 10 and the FPC substrate 50.

As illustrated in FIGS. 2 and 3, the liquid crystal panel 10 includes an array substrate 11 and a color filter substrate (CF substrate) 12 facing to each other; a liquid crystal layer 13 disposed between the substrates 11 and 12; and a seal 14 that seals the liquid crystal layer 13 between the substrates 11 and 12. A display section 15 is formed in the region where the substrates 11 and 12 face to each other.

The display section 15 includes multiple pixels 26. The pixels 26 are arranged in matrix in the row and column directions. Each of the pixels 26 consists of sub pixels having multiple colors (e.g. three colors including red, green and blue). The array substrate 11 includes a region (hereinafter, also referred to as a display region) 24 corresponding to the display section 15 and a peripheral region (flame region) 25 surrounding the display region 24.

The array substrate 11 includes various members formed on the insulating substrate 30. Specifically, the array substrate 11 includes multiple source bus lines and multiple gate bus lines (neither shown) crossed over each other in the display region 24. The array substrate 11 may include multiple common bus lines running parallel to the gate bus lines. The region of each sub pixel approximately corresponds to each region defined by the source bus lines and the gate bus lines or the common bus lines. The array substrate 11 includes multiple TFTs (not shown) that function as switching elements and transparent pixel electrodes (not shown) each connected to a corresponding TFT. Each TFT and each pixel electrode are disposed in a region corresponding to each sub pixel (hereinafter, also referred to as a sub pixel region). Each TFT is connected to a corresponding source bus line and gate bus line.

The seal 14 is formed to surround the display section 15. The seal 14 bonds the substrates 11 and 50 together to seal the liquid crystal layer 13 therebetween.

The material of the seal 14 (sealing material) is not particularly limited and may be any general sealing material. Examples thereof include sealing materials that do not have photocurability but have a thermosetting property, (hereinafter, also referred to as thermosetting sealing materials); sealing materials that do not have a thermosetting property but have photocurability (e.g. curability by ultraviolet irradiation), (hereinafter, also referred to as photocurable sealing materials); and sealing materials that have photocurability (e.g. curability by ultraviolet irradiation) and a thermosetting property (hereinafter, also referred to as photocurable and thermosetting sealing materials). In the case of performing the one drop filling (ODF) method for injecting liquid crystal material, photocurable sealing materials and photocurable and thermosetting sealing materials are suitable. In the case of performing the vacuum injection method, thermosetting sealing materials are suitable. Sealing materials generally contain an acrylic resin and/or an epoxy resin. Specific examples of the photocurable and thermosetting sealing materials include Photolec S series (from Sekisui Chemical Co., Ltd.) that mainly contain an epoxy acrylic resin.

The array substrate 11 includes, in the peripheral region 25, a protruding region 16 not facing to the CF substrate 12. The IC chip 53 and the FPC substrate 50 are mounted (disposed) on the array substrate 11 in the protruding region 16. The array substrate 11 may include one or more electronic components such as a resistor and a ceramic capacitor (hereinafter, such electronic components are also referred to as passive devices) in the protruding region 16.

The array substrate 11 includes multiple terminals 20 in the protruding region 16. The multiple terminals 20 include multiple terminals 21 and 22 to be connected to the IC chip and multiple terminals 23 to be connected to the FPC substrate. The array substrate 11 includes multiple wires 19 in the peripheral region 25. The wires 19 include connection wires 18 each configured to connect one of the terminals 22 to a corresponding terminal 23, and lead wires 17 each configured to connect one of the terminals 21 to a corresponding source bus line or gate bus line.

The terminals 20 may be connected to appropriately selected portions. For example, the terminals 20 may include terminals to be connected to the passive devices.

The IC chip 53 is a bare chip including multiple bumps 54 that function as terminals and is mounted on the array substrate 11 by the chip-on-glass (COG) method. The IC chip 53 includes drive circuits configured to drive the gate bus lines and source bus lines. At least a part of the drive circuits (e.g. a drive circuit for the gate bus lines) may be monolithically formed on the array substrate 11. The IC chip 53 may be an LSI chip.

The FPC substrate 50 is a bendable printed wiring board and includes a flexible insulating film 51 formed from a resin (e.g. polyimide) and multiple wires 52 each formed on the film 51. The end of each of the wires 52 function as terminals. The FPC substrate 50 may include one or more passive devices.

The IC chip 53 and the FPC substrate 50 are electrically connected to the liquid crystal panel 10 by thermocompression bonding (fixing) through the anisotropic conductive members 57 and 60, respectively. The anisotropic conductive member 57 covers the terminals 21 and 22, and the anisotropic conductive member 60 covers the terminals 23. The anisotropic conductive member 57 contains a thermosetting resin 55 (e.g. epoxy resin) and a large number of conductive particles 56 contained in the thermosetting resin 55. The anisotropic conductive member 60 contains a thermosetting resin 58 (e.g. epoxy resin) and a large number of conductive particles 59 contained in the thermosetting resin 58. The anisotropic conductive members 57 and 60 can show conductivity in the vertical direction (normal direction of the substrate 11) and insulation properties in the horizontal direction (the planar direction of the substrate 11). The anisotropic conductive members 57 and 60 are each preferably formed from an ACF. The material for the anisotropic conductive members is not limited to ACFs and may be an anisotropic conductive paste. Anisotropic conductive materials such as an ACF can electrically connect electronic components so as to maintain the conductivity between the terminals (electrodes) facing to each other and the electrical insulation between the terminals (electrodes) adjacent to each other. Furthermore, such anisotropic conductive materials can mechanically fix the electronic components.

Referring to FIGS. 4(a) to 4(c), the following describes each structure of a TFT portion in a pixel, the periphery of a terminal 20, and the periphery of an end face (cut cross section) of the array substrate 11. FIGS. 4(a) to 4(c) are schematic cross-sectional views of the array substrate of Embodiment 1; FIG. 4(a) illustrates a TFT portion; FIG. 4(b) illustrates the periphery of a terminal; and FIG. 4(c) illustrates the periphery of an end face of the array substrate.

As illustrated in FIG. 4(a), the TFT portion includes a TFT 49 having a bottom gate structure. The TFT portion includes a gate electrode 37 on the insulating substrate 30; an inorganic insulating layer 31 covering the gate electrode 37; an inorganic insulating layer 32 on the inorganic insulating layer 31; an island-shaped semiconductor layer 38 which is formed on the inorganic insulating layer 32 and which overlaps the gate electrode 37; a protective layer 33 on the semiconductor layer 38 and the inorganic insulating layer 32; a source electrode 39 and a drain electrode 40 on the protective layer 33; an inorganic insulating layer 34 on the source electrode 39 and the drain electrode 40; an organic insulating layer 35 on the inorganic insulating layer 34; a transparent conductive layer 41 on the organic insulating layer 35; an inorganic insulating layer 36 on the transparent conductive layer 41; and a transparent conductive layer 42 on the inorganic insulating layer 36. The array substrate 11 has an alignment film (not shown) on the surface of the liquid-crystal-layer-13 side.

The TFT 49 includes the gate electrode 37, the inorganic insulating layers 31 and 32, the semiconductor layer 38, the protective layer 33, the source electrode 39, and the drain electrode 40. The gate electrode 37 is connected to a corresponding gate bus line, and the source electrode 39 is connected to a corresponding source bus line. The inorganic insulating layers 31 and 32 function as a gate insulator in the TFT portion. The protective layer 33 functions as an etching stopper (ES) layer and covers the channel region of the semiconductor layer 38 in the TFT portion. The source electrode 39 and the drain electrode 40 are each connected to the semiconductor layer 38 through the apertures of the protective layer 33.

The organic insulating layer 35 and the inorganic insulating layers 34 and 36 have apertures 35a, 34a, and 36a, respectively, above the drain electrode 40. The transparent conductive layer 42 is connected to the drain electrode 40 through these apertures. The aperture 35a is larger than the apertures 34a and 36a that are formed in the aperture 35a. The side of the inorganic insulating layer 34 facing the aperture 34a forms a flush surface with the side of the inorganic insulating layer 36 facing the aperture 36a. The transparent conductive layer 42 includes slits (elongated apertures, not shown) formed parallel to one another. The transparent conductive layer 41 is formed to cover the entire sub pixel region except for the aperture 35a.

A scanning signal is supplied in a pulsed manner from the IC chip 53 to the gate bus line and the gate electrode 37 at a predetermined timing and is applied to each TFT 49 by a line-sequential system. The TFT 49 is switched on for a certain period of time by the input scanning signal. The transparent conductive layer 42 functions as a pixel electrode. While the TFT 49 is switched on, an image signal is supplied to the transparent conductive layer 42 from the IC chip 53 through the source bus line and the TFT 49. Meanwhile, a common signal which is commonly applied to all the pixels is supplied to the transparent conductive layer 41. Thus, when an image signal is applied to the transparent conductive layer 42, parabolic electric flux lines are generated between the transparent conductive layer 42 and the transparent conductive layer 41, and a fringe electric field is thereby generated in the liquid crystal layer 13 according to the image signal. This fringe electric field controls the alignment of liquid crystal molecules (typically, nematic liquid crystal molecules having positive dielectric anisotropy) and thereby controls the optical transmittance of each sub pixel. A large number of sub pixels are thus independently driven, and thereby an image is displayed in the display section 15. The transparent conductive layer 41 makes a pair with the transparent conductive layer 42 and functions as a common electrode that drives the liquid crystal layer 13.

The transparent conductive layer 42 overlaps the transparent conductive layer 41, and the inorganic insulating layer 36 is placed between these layers. Common signals are applied to the transparent conductive layer 41. Thus, when image signals are applied to the transparent conductive layer 42, these transparent members form a storage capacitance. The transparent conductive layers 41 and 42 thus also function as storage capacitance electrodes. The inorganic insulating layer 36 functions as an insulator between the transparent conductive layer 41 and the transparent conductive layer 42 in the display region including the TFT portion, and also functions as a dielectric configured to form a storage capacitance.

Inorganic insulating films generally have better barrier properties to moisture than organic insulating films. In the present embodiment, a side 35b facing the aperture 35a of the organic insulating layer 35 is covered with the inorganic insulating layer 36. This structure thus can suppress entrance of moisture from the side 35b into the organic insulating layer 35. As a result, peeling in the TFT portion can be suppressed.

The inorganic insulating layer 34 partly protrudes from the organic insulating layer 35, and an upper face 34c of the protruding part is in contact with the inorganic insulating layer 36. This structure enables the inorganic insulating layer 36 to entirely cover the side 35b of the organic insulating layer 35.

The liquid crystal layer 13 is placed on the array substrate 11 and sealed by the seal 14 between the array substrate 11 and the CF substrate 12. In the step of producing the array substrate 11, however, no liquid crystal layer 13 exists and thus moisture may enter the organic insulating layer 35. Employing the above structure in the TFT portion is thus technically important.

As illustrated in FIG. 4(b), the peripheral region 25, especially the periphery of the terminal 20 (e.g. the portion surrounded by the dashed circle in FIG. 3), includes wires 43 on the insulating substrate 30. The wires 43 are covered with the aforementioned inorganic insulating layers 31 and 32 and protective layer 33. On the protective layer 33, the aforementioned inorganic insulating layer 34 and the organic insulating layer 35 are stacked in this order. Transparent conductive layers 44 are formed on the organic insulating layer 35. The aforementioned inorganic insulating layer 36 is formed on the transparent conductive layers 44. Also in the periphery of the terminal 20, each side of the inorganic insulating layer 34 forms a flush surface with the corresponding side of the inorganic insulating layer 36. The wires 43 and the transparent conductive layers 44 are not limited and may be used for any appropriate application. For example, the wires 43 may be used as the aforementioned wire 19 or a wire for testing. The wires 43 and/or the transparent conductive layers 44 may not be formed.

A side 35d of the organic insulating layer 35 is covered with the inorganic insulating layer 36. This structure thus can suppress entrance of moisture from the side 35d into the organic insulating layer 35. As a result, peeling in the periphery of the terminal 20 can be suppressed.

The inorganic insulating layer 34 partly protrudes from the organic insulating layer 35. An upper face 34e of the protruding part is in contact with the inorganic insulating layer 36. This structure enables the inorganic insulating layer 36 to entirely cover the side 35d of the organic insulating layer 35.

The aforementioned structure may be exposed to the air or may be covered with the anisotropic conductive member 57 or 60. Even if the structure is covered with the anisotropic conductive member 57 or 60, moisture may enter the organic insulating layer 35 until the IC chip 53 and the FPC substrate 50 are mounted on the array substrate 11. Employing the above structure in this case is thus also technically important.

As illustrated in FIG. 4(c), in the peripheral region 25, especially in the periphery of an end face 11a of the array substrate 11 (e.g. the region surrounded by the dot-dash-line circle in FIG. 3), the aforementioned inorganic insulating layers 31 and 32 and protective layer 33 are stacked in this order on the insulating substrate 30. The end face 11a is not limited and may be placed at any part on the four sides of the array substrate 11. Wires 45 are formed on the protective layer 33. The inorganic insulating layer 34, the organic insulating layer 35, and the inorganic insulating layer 36 are stacked in this order on the protective layer 33 and the wires 45. Also in the periphery of the end face 11a of the array substrate 11, a side 34f of the inorganic insulating layer 34 forms a flush surface with the corresponding side of the inorganic insulating layer 36. The end face 11a of the array substrate 11 includes a side of the insulating substrate 30, sides of the inorganic insulating layers 31 and 32, and a side of the protective layer 33. The wires 45 are not limited and may be used for any appropriate application, such as a lead wire. The wires 45 may be disposed between the insulating substrate 30 and the inorganic insulating layer 31. The wires 45 may not be disposed.

A side 35f of the organic insulating layer 35 is covered with the inorganic insulating layer 36. This structure thus can suppress entrance of moisture from the side 35f into the organic insulating layer 35. As a result, peeling in the periphery of the end face 11a of the array substrate 11 can be suppressed.

The inorganic insulating layer 34 partly protrudes from the organic insulating layer 35 and an upper face 34g of the protruding part is in contact with the inorganic insulating layer 36. This structure enables the inorganic insulating layer 36 to entirely cover the side 35f of the organic insulating layer 35. The side 35f of the organic insulating layer 35 and the side 34f of the inorganic insulating layer 34 may form a flush surface with the end face 11a of the array substrate 11. In other words, the end face 11a may include the sides 34f and 35f.

The aforementioned structure may be exposed to the air or covered with the seal 14. Even if this structure is covered with the seal 14, moisture may enter the organic insulating layer 35 until the CF substrate 12 is bonded to the array substrate 11. Employing the above structure in this case is thus also technically important. This structure may be covered with the anisotropic conductive member 57 or 60.

The end face 11a of the array substrate 11 may include a side of glass substrate as the insulating substrate 30, a side of a SiNx layer as the inorganic insulating layer 31, a side of a $SiO_2$ layer as the inorganic insulating layer 32, and a side of a $SiO_2$ layer as the protective layer 33. The end face 11a may further include a side of a $SiO_2$ layer as the inorganic insulating film 34 and a side of a SiNx layer as the inorganic insulating film 36.

As illustrated in FIGS. 4(a) to 4(c), since the upper face of the organic insulating layer 35 is covered with the inorganic insulating layer 36 in each part, entrance of moisture from the upper face can also be suppressed. The side of the organic insulating layer 35 is inclined toward the insulating substrate 30 in each part, and the organic insulating layer 35 thus has an upward tapered shape.

The following describes a method of producing the liquid crystal display of the present embodiment.

First, an insulating substrate 30 having an insulating surface is prepared. Examples of the insulating substrate 30 include insulating substrates generally used for displays, such as glass substrates, silicon substrates, and heat resistant plastic substrates. Examples of the material for the plastic substrates include polyethylene terephthalate resin, polyethylene naphthalate resin, polyether sulfone resin, acrylic resin, and polyimide resin.

FIGS. 5(a) to 5(c) are schematic cross-sectional views of members in the production process (production step of a gate layer) of the array substrate of Embodiment 1; FIG. 5(a) illustrates a TFT portion; FIG. 5(b) illustrates the periphery of a terminal; and FIG. 5(c) illustrates the periphery of an end face of the array substrate.

A first conductive film is formed by sputtering on the entire surface of the insulating substrate 30. A first resist is then formed on the first conductive film by photolithography. The first conductive film covered with the first resist as a mask is subjected to wet etching, and the first resist is then removed. This process provides a layer (hereinafter, also referred to as a gate layer) including members such as the gate electrodes 37, the wires 43, gate bus lines, and common bus lines as illustrated in FIGS. 5(a) to 5(c). The gate electrodes 37 are integrally formed with the gate bus lines. The first conductive film may be made of a film that contains, for example, molybdenum (Mo), titanium (Ti), aluminum (Al), copper (Cu), tungsten (W), tantalum (Ta), chromium (Cr), or an alloy or a nitride of these. The first conductive film may be a multilayer film that is a stack of multiple kinds of films. The first conductive film may be a multilayer film including a 200-nm-thick Cu film stacked on a 30-nm-thick Ti film.

FIGS. 6(a) to 6(c) are schematic cross-sectional views of members in the production process (film production step of first and second insulating films) of the array substrate of Embodiment 1; FIG. 6(a) illustrates a TFT portion; FIG. 6(b) illustrates the periphery of a terminal; and FIG. 6(c) illustrates the periphery of an end face of the array substrate.

As illustrated in FIGS. 6(a) to 6(c), a first insulating film 46 for the inorganic insulating layer 31 is formed by chemical vapor deposition (CVD) on the entire surface of the substrate including the gate layer. A second insulating film 47 for the inorganic insulating layer 32 is then formed on the entire surface of the first insulating film 46. Examples of the first insulating film 46 include silicon nitride (SiNx) films and silicon nitride oxide (SiNxOy, x>y) films. Silicon nitride (SiNx) films are particularly suitable. Examples of the second insulating film 47 include silicon oxide films (e.g. $SiO_2$ films) and silicon oxynitride (SiOxNy, x>y) films. The second insulating film 47 preferably contains silicon oxide, particularly $SiO_2$, in terms of reducing the oxygen loss in the case where the semiconductor layer 38 includes an oxide semiconductor. Silicon oxide films unfortunately have poorer barrier properties to moisture (hereinafter, also referred to as moisture-barrier properties) than nitrogen-containing silicon films (e.g. silicon nitride films). Thus, the inorganic insulating layer 32 formed from the second insulating film 47 is disadvantageous in terms of moisture-barrier properties. Meanwhile, the inorganic insulating layer 31 formed from the first insulating film 46 is advantageous in terms of moisture-barrier properties. The first insulating film 46 may be a 400-nm-thick SiNx film, and the second insulating film 47 may be a 50-nm-thick $SiO_2$ film.

Next, a semiconductor film is formed on the entire surface of the substrate including the second insulating film 47 by, for example, sputtering or CVD. After the formation of the semiconductor film, the substrate may be annealed.

Examples of the semiconductor include semiconductors made of group 14 element(s) and oxide semiconductors. Oxide semiconductors are particularly suitable. An oxide semiconductor preferably contains oxygen (O) and at least one element selected from the group consisting of indium (In), gallium (Ga), aluminum (Al), copper (Cu), zinc (Zn), magnesium (Mg), and cadmium (Cd), and more preferably contains indium (In), gallium (Ga), zinc (Zn), and oxygen (O). An oxide semiconductor enables the TFT 49 to have higher mobility than an amorphous silicon semiconductor. Thus, even in a high-resolution device, namely, even in a device including TFTs 49 each having a short ON time per sub pixel, the device can apply a sufficient voltage to the liquid crystal layer 13. Additionally, an oxide semiconductor can reduce the leakage current of the TFT 49 in off state compared with an amorphous silicon semiconductor. Thus, regardless of having a high resolution or not, the resulting device including an oxide semiconductor may be driven by a low frequency or with a non-driven period. As a result, power consumption can be reduced.

If the semiconductor layer 38 includes an oxide semiconductor (particularly, an oxide semiconductor containing indium (In), gallium (Ga), zinc (Zn), and oxygen (O)) and the inorganic insulating layer 34 is formed of silicon oxide (e.g. $SiO_2$), the adhesion between the inorganic insulating layer 34 and the organic insulating layer 35 tends to be deteriorated. The present embodiment is thus suitable in the case where the semiconductor layer 38 includes an oxide semiconductor, more suitable in the case where the semiconductor layer 38 contains oxygen (O) and at least one element selected from the group consisting of indium (In), gallium (Ga), aluminum (Al), copper (Cu), zinc (Zn), magnesium (Mg), and cadmium (Cd), and particularly suitable in the case where the semiconductor layer 38 contains indium (In), gallium (Ga), zinc (Zn), and oxygen (O).

Specific examples of the oxide semiconductor include In—Ga—Zn—O (indium gallium zinc oxide), $InGaO_3(ZnO)_5$, $Mg_xZn_{1-x}O$, $Cd_xZn_{1-x}O$, and CdO. Alternatively, the oxide semiconductor may be an amorphous, polycrystalline, or microcrystalline ZnO that contains at least one element (impurity element) selected from the group consisting of elements of groups 1, 13, 14, 15, and 17, or an amorphous, polycrystalline, or microcrystalline ZnO that does not contain the impurity elements. Here, the term microcrystalline refers to an amorphous and polycrystalline mixed state.

Figure 7:
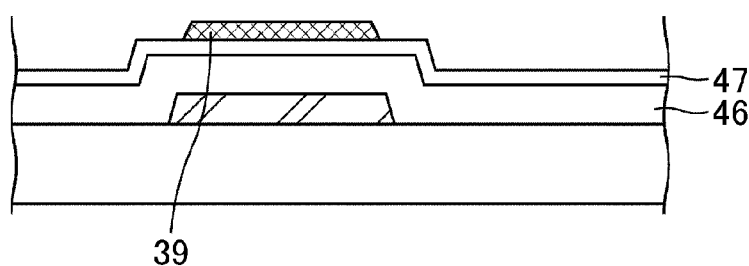
FIGS. 7(a) to 7(c) are schematic cross-sectional views of members in the production process (production step of semiconductor layers) of the array substrate of Embodiment 1.
Figure 7:
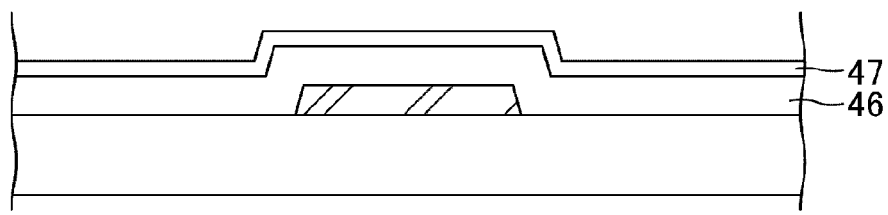
Figure 7:
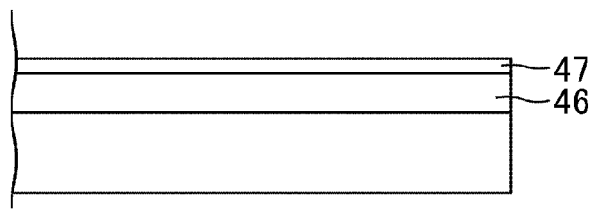

FIGS. 7(*a*) to 7(*c*) are schematic cross-sectional views of members in the production process (production step of semiconductor layers) of the array substrate of Embodiment 1; FIG. 7(*a*) illustrates a TFT portion; FIG. 7(*b*) illustrates the periphery of a terminal; and FIG. 7(*c*) illustrates the periphery of an end face of the array substrate.

After annealing the semiconductor film, a second resist is formed on the semiconductor film by photolithography. The semiconductor film covered with the second resist as a mask is subjected to wet etching, and the second resist is then removed. Thus, the semiconductor layers 38 are formed as illustrated in FIG. 7.

Figure 8:
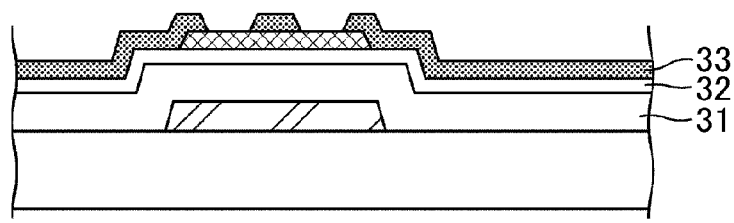
FIGS. 8(a) to 8(c) are schematic cross-sectional views of members in the production process (production step of inorganic insulating layers and a protective layer) of the array substrate of Embodiment 1.
Figure 8:
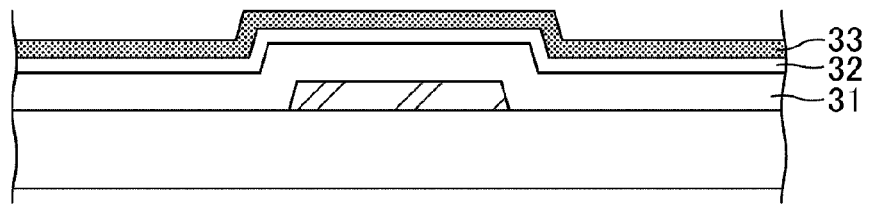
Figure 8:
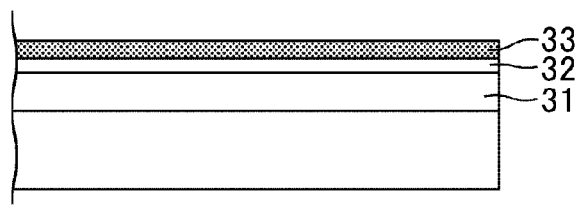

FIGS. 8(*a*) to 8(*c*) are schematic cross-sectional views of members in the production process (production step of inorganic insulating layers and a protective layer) of the array substrate of Embodiment 1; FIG. 8(*a*) illustrates a TFT portion; FIG. 8(*b*) illustrates the periphery of a terminal; and FIG. 8(*c*) illustrates the periphery of an end face of the array substrate.

A third insulating film for the protective layer 33 is formed by CVD on the entire surface of the substrate including the semiconductor layers 38. A third resist is then formed on the third insulating film by photolithography. The first to third insulating films covered with the third resist as a mask are subjected to dry etching, and the third resist is then removed. Thus, the inorganic insulating layers 31 and 32 and the protective layer 33 are formed as illustrated in FIGS. 8(*a*) to 8(*c*). Apertures are formed in the protective layer 33 on the semiconductor layers 38. Also, apertures (not shown) penetrating the inorganic insulating layers 31 and 32 and the protective layer 33 is formed on a predetermined position above the gate layer to connect the source layer to the gate layer. Examples of the third insulating film include silicon oxide films (e.g. $SiO_2$ films), silicon nitride (SiNx) films, and silicon oxynitride (SiOxNy, x>y) films. The third insulating film may be a 100-nm-thick $SiO_2$ film.

The protective layer 33 may not be formed depending on the material of the semiconductor layers 38. If the semiconductor layers 38 include oxide semiconductors, the protective layer 33 is preferably formed and preferably contains silicon oxide (more preferably, $SiO_2$). Such a structure can effectively reduce the oxygen loss of the semiconductor layers 38. As mentioned above, since silicon oxide films unfortunately do not have excellent moisture-barrier properties, the protective layer 33 is disadvantageous in terms of moisture-barrier properties.

Figure 9:
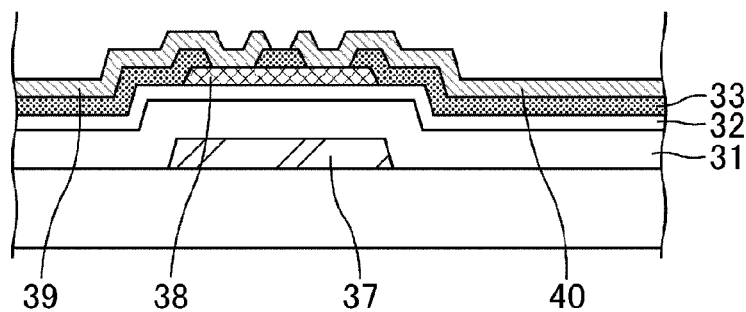
FIGS. 9(a) to 9(c) are schematic cross-sectional views of members in the production process (production step of a source layer) of the array substrate of Embodiment 1.
Figure 9:
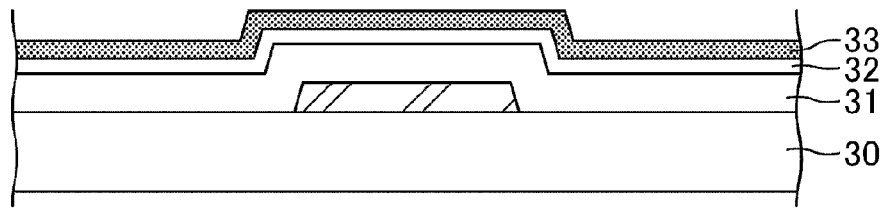
Figure 9:
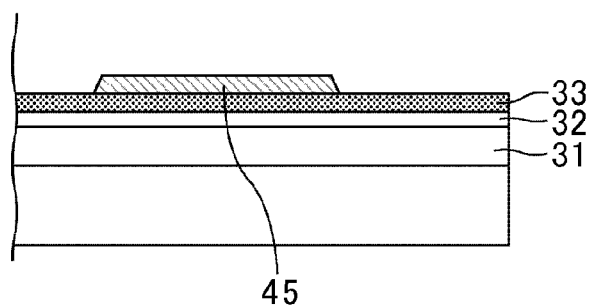

FIGS. 9(*a*) to 9(*c*) are schematic cross-sectional views of members in the production process (production step of a source layer) of the array substrate of Embodiment 1; FIG. 9(*a*) illustrates a TFT portion; FIG. 9(*b*) illustrates the periphery of a terminal; and FIG. 9(*c*) illustrates the periphery of an end face of the array substrate.

A second conductive film is formed by sputtering on the entire surface of the substrate including the protective layer 33. A fourth resist is formed on the second conductive film by photolithography. The second conductive film covered with the fourth resist as a mask is then subjected to wet etching, and the fourth resist is then removed. Thus, a layer (hereinafter, also referred to as a source layer) including the source electrodes 39, the drain electrodes 40, source bus lines, and the wires 45 is formed as illustrated in FIGS. 9(*a*) to 9(*c*). The source electrodes 39 are integrally formed with the source bus lines. The fourth conductive film may be a film that contains, for example, molybdenum (Mo), titanium (Ti), aluminum (Al), copper (Cu), tungsten (W), tantalum (Ta), chromium (Cr), or an alloy or a nitride of these. The first conductive film may be a multilayer that is a stack of multiple kinds of films. The second conductive film may be a multilayer film including a 200-nm-thick Cu film stacked on a 30-nm-thick Ti film. The protective layer 33 functions as an etching stopper layer (ES layer) during etching the second conductive film, to protect the channel regions of the semiconductor layers 38.

Figure 10:
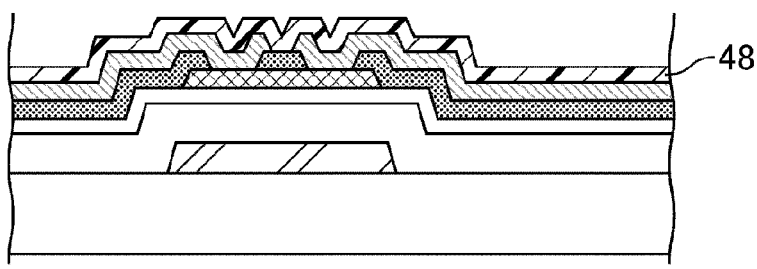
FIGS. 10(a) to 10(c) are schematic cross-sectional views of members in the production process (film production step of a fourth insulating film) of the array substrate of Embodiment 1.
Figure 10:
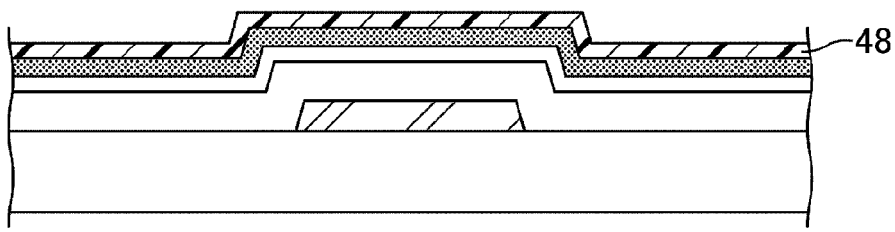
Figure 10:
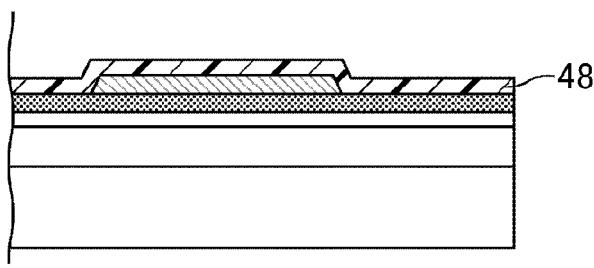
Figure 11:
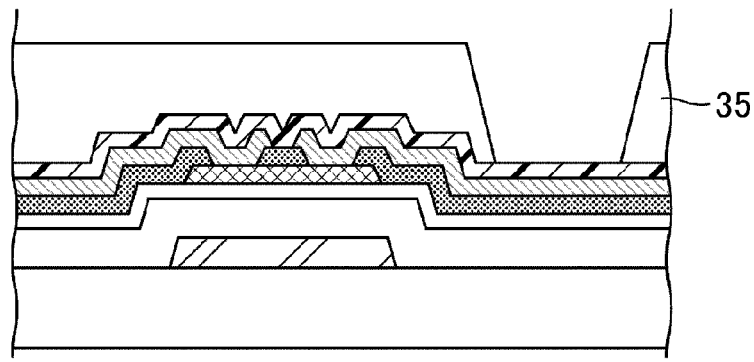
FIGS. 11(a) to 11(c) are schematic cross-sectional views of members in the production process (production step of an organic insulating layer) of the array substrate of Embodiment 1.
Figure 11:
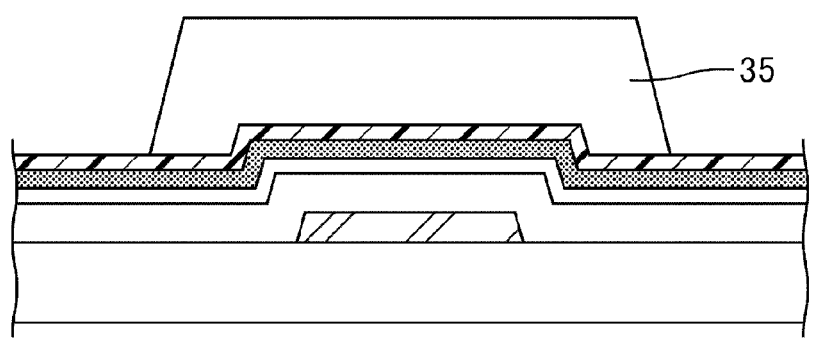
Figure 11:
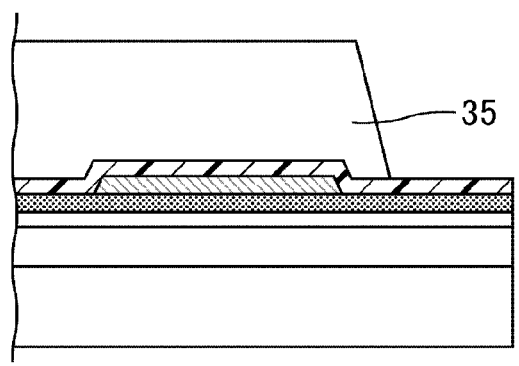
Figure 12:
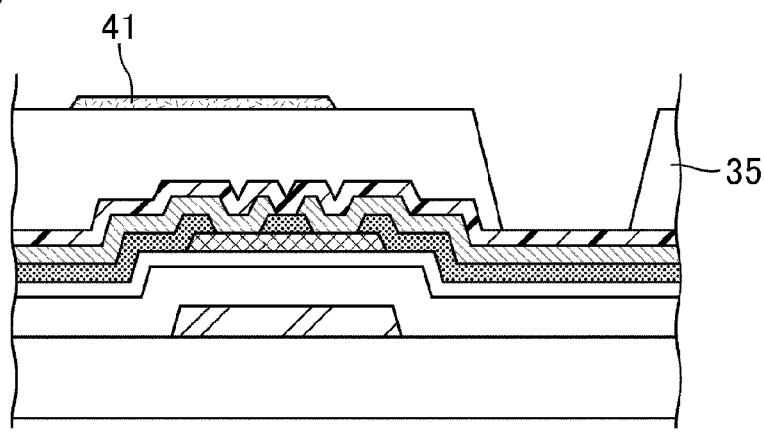
FIGS. 12(a) to 12(c) are schematic cross-sectional views of members in the production process (production step of transparent conductive layers) of the array substrate of Embodiment 1.
Figure 12:
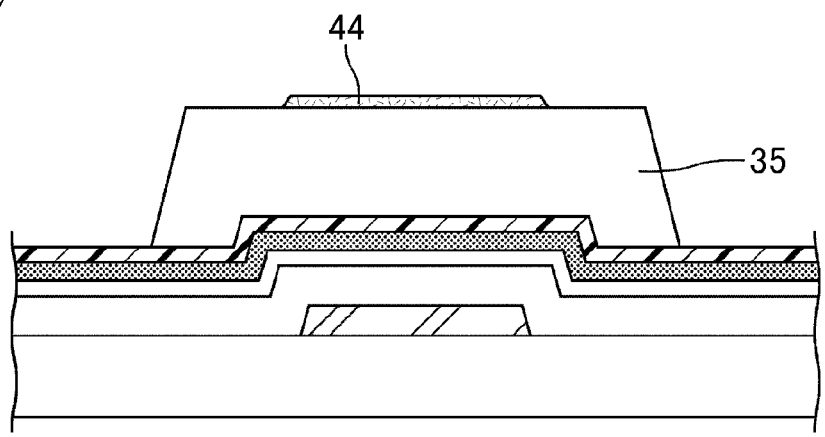
Figure 12:
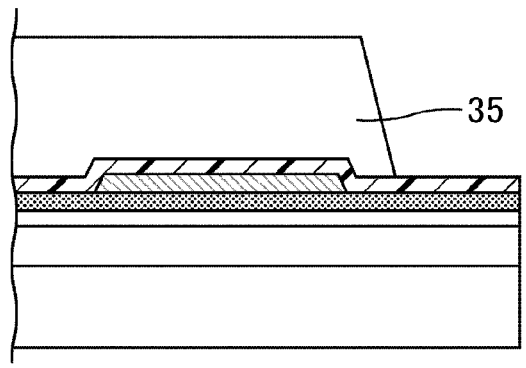
Figure 13:
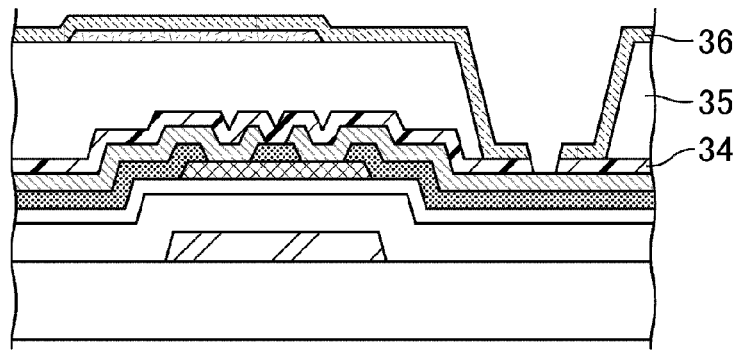
FIGS. 13(a) to 13(c) are schematic cross-sectional views of members in the production process (production step of inorganic insulating layers) of the array substrate of Embodiment 1.
Figure 13:
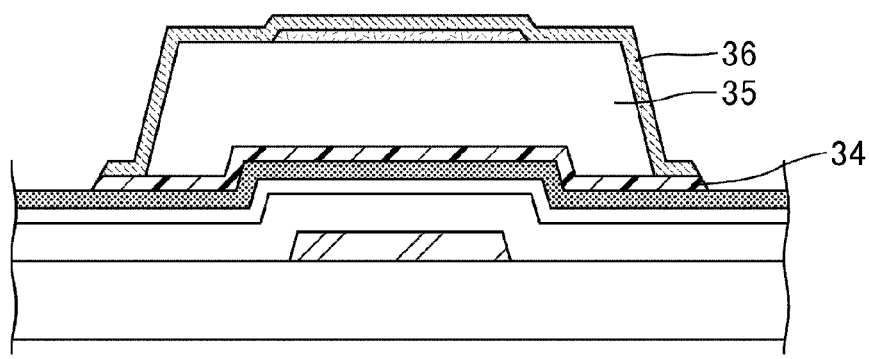
Figure 13:
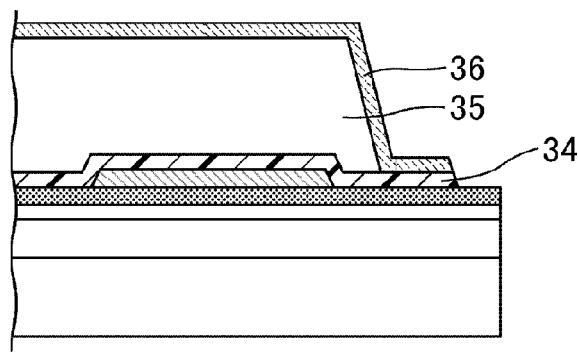

FIGS. 10(*a*) to 10(*c*) are schematic cross-sectional views of members in the production process (film production step of a fourth insulating film) of the array substrate of Embodiment 1; FIG. 10(*a*) illustrates a TFT portion; FIG. 10(*b*) illustrates the periphery of a terminal; and FIG. 10(*c*) illustrates the periphery of an end face of the array substrate.

A fourth insulating film (passivation film) 48 for the inorganic insulating layer 34 is formed by CVD on the entire surface of the substrate including the source layer as illustrated in FIGS. 10(*a*) to 10(*c*). After the formation of the fourth insulating film 48, the substrate may be annealed.

The material of the inorganic insulating layer 34 (fourth insulating film 48) may be appropriately selected, and examples thereof include silicon oxides (e.g. $SiO_2$), silicon nitrides (SiNx), silicon nitride oxides (SiNxOy, x>y), and silicon oxynitrides (SiOxNy, x>y). However, as mentioned above, if the inorganic insulating layer 34 contains silicon oxide (e.g. $SiO_2$), the adhesion between the inorganic insulating layer 34 and the organic insulating layer 35 tends to be deteriorated, which tends to cause peeling. The present embodiment is thus suitable in the case where the inorganic insulating layer 34 contains silicon oxide, particularly $SiO_2$. This structure is also preferred in terms of reducing the oxygen loss in the case where the semiconductor layers 38 include oxide semiconductors. The fourth insulating film may be a 200-nm-thick $SiO_2$ film. As mentioned above, since silicon oxide films unfortunately do not have excellent moisture-barrier properties, the inorganic insulating layer 34 is disadvantageous in terms of moisture-barrier properties.

The thickness of the inorganic insulating layer 34 is not limited and the inorganic insulating layer 34 may have an appropriate film thickness. The thickness is preferably 50 nm to 500 nm, more preferably 100 nm to 300 nm. Too thin an inorganic insulating layer 34 may cause troubles in terms of moisture-barrier properties and channel region protection. Too thick an inorganic insulating layer 34, in contrast, may cause troubles in terms of adhesion, coverage in the tapered portions, and productivity (e.g. film forming time, etching time).

Subsequently, the material of the organic insulating layer 35 is applied to the entire surface of the substrate including the fourth insulating film 48 by, for example, spin coating or slit coating. The coating film is then dried to form an organic insulating film having a flat surface. The organic insulating film is then patterned.

Examples of the organic insulating film include photosensitive or non-photosensitive resin films. Specific examples of the resin include acrylic resin and photosensitive polyimide. The organic insulating film may be a 3-μm-thick positive photosensitive acrylic resin film. If a photosensitive resin film is used as the organic insulating film, the organic insulating film may be exposed to light and then developed to be patterned without forming a resist.

FIGS. 11(a) to 11(c) are schematic cross-sectional views of members in the production process (production step of an organic insulating layer) of the array substrate of Embodiment 1; FIG. 11(a) illustrates a TFT portion; FIG. 11(b) illustrates the periphery of a terminal; and FIG. 11(c) illustrates the periphery of an end face of the array substrate.

After patterning of the organic insulating film, the patterned organic insulating film is annealed and fired. Thereby, the organic insulating layer 35 is formed as illustrated in FIGS. 11(a) to 11(c). The apertures 35a and the sides 35b, 35d, and 35f are formed in the organic insulating layer 35. The sides 35b, 35d, and 35f can each have a smooth curved surface by the annealing. The annealing is performed, for example, at 200° C. for one hour.

The thickness of the organic insulating layer 35 is not limited and the organic insulating layer 35 may have any appropriate film thickness. The film thickness is preferably 1 μm to 5 μm, more preferably 2 μm to 4 μm. Too thin an organic insulating layer 35 may fail to achieve the object of the flat surface sufficiently, and may lead to an increase in the capacitance formed by the upper and lower layers of the organic insulating layer 35. Too thick an organic insulating layer 35, in contrast, may cause troubles (e.g. filled holes, reduction in productivity due to increased exposure energy) in processing such as aperture formation or troubles of reduction of transmittance.

FIGS. 12(a) to 12(c) are schematic cross-sectional views of members in the production process (production step of transparent conductive layers) of the array substrate of Embodiment 1; FIG. 12(a) illustrates a TFT portion; FIG. 12(b) illustrates the periphery of a terminal; and FIG. 12(c) illustrates the periphery of an end face of the array substrate.

A first transparent conductive film is formed by sputtering on the entire surface of the substrate including the organic insulating layer 35. A fifth resist is formed on the first transparent conductive film by photolithography. The first transparent conductive film covered with the fifth resist as a mask is subjected to wet etching, and the fifth resist is then removed. After the patterning of the first transparent conductive film, the first transparent conductive film is annealed and polycrystalized. Thereby, transparent conductive layers 41 and 44 are formed as illustrated in FIGS. 12(a) to 12(c).

The material of the first transparent conductive film may be a translucent conductive material. Specific examples thereof include indium tin oxide (ITO), indium zinc oxide (IZO), indium tin oxide containing silicon oxide (ITSO), indium oxide ($In_2O_3$), tin oxide ($SnO_2$), zinc oxide (ZnO), and titanium nitride (TiN). The first transparent conductive film may be a multilayer film that is a stack of multiple kinds of films. The first transparent conductive film may be a 100-nm-thick ITO film.

FIGS. 13(a) to 13(c) are schematic cross-sectional views of members in the production process (production step of inorganic insulating layers) of the array substrate of Embodiment 1; FIG. 13(a) illustrates a TFT portion; FIG. 13(b) illustrates the periphery of a terminal; and FIG. 13(c) illustrates the periphery of an end face of the array substrate.

A fifth insulating film (passivation film) for the inorganic insulating layer 36 is formed by CVD on the entire surface of the substrate including the transparent conductive layers 41 and 44. A sixth resist is then formed on the fifth insulating film by photolithography. The fourth and fifth insulating films covered with the sixth resist as a mask are subjected to dry etching, and the sixth resist is then removed. Thereby, the inorganic insulating layers 34 and 36 are formed as illustrated in FIGS. 13(a) to 13(c). At this stage, the sides of the organic insulating layer 35 are covered with the inorganic insulating layer 36. The apertures 34a and 36a are formed in the inorganic insulating layers 34 and 36, respectively. Since the fourth and fifth insulating films are etched together, the side of the inorganic insulating layer 34 forms a flush surface with the side of the inorganic insulating layer 36.

The material of the inorganic insulating layer 36 (fifth insulating film) may be appropriately selected. Examples thereof include silicon oxides (e.g. $SiO_2$), silicon nitrides (SiNx), silicon nitride oxides (SiNxOy, x>y), and silicon oxynitrides (SiOxNy, x>y). Silicon nitrides (SiNx) are particularly suitable because silicon nitride films have more excellent adhesion with resin films and more excellent moisture-barrier properties than silicon oxide films. Silicon nitrides are also preferred in terms of enhancing the dielectric constant of the inorganic insulating layer 36. The inorganic insulating layer 36 is thus advantageous in terms of moisture-barrier properties. The fifth insulating film may be a 300-nm-thick SiNx film.

The thickness of the inorganic insulating layer 36 is not limited and the inorganic insulating layer 36 may have any appropriate film thickness. The film thickness is preferably 50 nm to 500 nm, more preferably 100 nm to 300 nm. Too thin an inorganic insulating layer 36 may cause troubles in terms of moisture-barrier properties and channel region protection. Too thick an inorganic insulating layer 36, in contrast, may cause troubles in terms of adhesion, coverage in the tapered portions, and productivity (e.g. film forming time, etching time).

Next, a second transparent conductive film is formed by sputtering on the entire surface of the substrate including the inorganic insulating layer 36. A seventh resist is formed on the second transparent conductive film by photolithography. The second transparent conductive film covered with the seventh resist as a mask is subjected to wet etching, and the seventh resist is then removed. The material of the second transparent conductive film may be a translucent conductive material. Specific examples thereof include indium tin oxide (ITO), indium zinc oxide (IZO), indium tin oxide containing silicon oxide (ITSO), indium oxide ($In_2O_3$), tin oxide ($SnO_2$), zinc oxide (ZnO), and titanium nitride (TiN). The second transparent conductive film may be a multilayer film that is a stack of multiple kinds of films. The second transparent conductive film may be a 100-nm-thick ITO film. After the patterning of the second transparent conductive film, the second transparent conductive film is annealed and polycrystalized. Thus, transparent conductive layers 42 are formed as illustrated in FIG. 4(a).

Through these steps, the array substrate is completed. At this stage, circuit patterns for multiple panels are formed on the insulating substrate 30 which is a single substrate.

In the following cell assembling step, an alignment film containing an organic resin such as polyimide is formed by application onto the surface of the array substrate and onto the surface of a separately formed CF substrate. Each alignment film is then subjected to alignment treatment by, for example, rubbing treatment or photo-alignment process, so as to arrange liquid crystal molecules in a predetermined direction.

Next, a sealing material is applied to the array substrate or the CF substrate in a manner to surround the display region. A liquid crystal material is then added dropwise to the array substrate or CF substrate. The both substrates are placed together in a manner that the alignment films of the substrates face to each other. The sealing material is then cured to bond the substrates. Thus, a liquid crystal layer is formed between the substrates.

Through segmentation of the panel and bonding of a polarizer and a phase plate (optional), a liquid crystal panel is completed. An IC chip and an FPC substrate are connected to the liquid crystal panel, a control part and a backlight unit are disposed on the liquid crystal panel, and the resulting panel with these members is then accommodated in a casing. Thus, the liquid crystal display of Embodiment 1 is completed.

(Embodiment 2)

The present embodiment is substantially the same as Embodiment 1, except that the coating structure of the inorganic insulating layers and the production process of the array substrate are different. Thus, the features unique to the present embodiment are mainly described, and the descriptions redundant with Embodiment 1 are omitted. Members (including regions and sections) having the function the same as or similar to those of Embodiment 1 are given the same symbols as in Embodiment 1, and the descriptions of the members are omitted.

Figure 14:
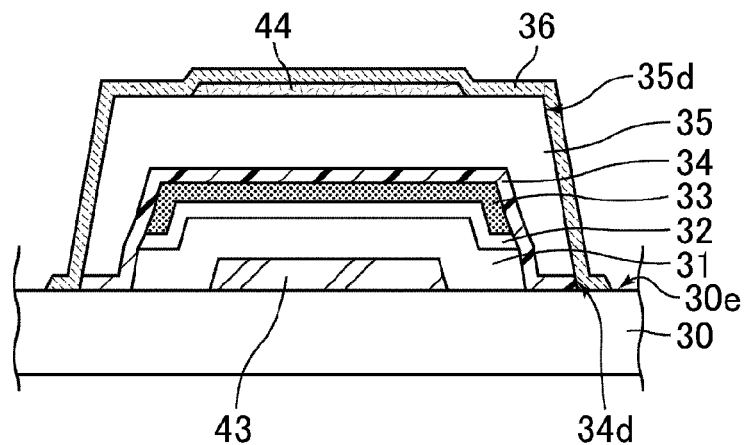
FIG. 14 is a schematic cross-sectional view of the array substrate of Embodiment 2, illustrating the periphery of a terminal.

Referring to FIGS. 3 and 14, the structure of the periphery of a terminal of the present embodiment is described. FIG. 14 is a schematic cross-sectional view of the array substrate of Embodiment 2, illustrating the periphery of a terminal.

As illustrated in FIGS. 3 and 14, wires 43 are formed on an insulating substrate 30 in a peripheral region 25, particularly in the periphery of a terminal 20 (e.g. the portion surrounded by the dashed circle in FIG. 3). Inorganic insulating layers 31 and 32 and a protective layer 33 are stacked in this order on the wires 43. An inorganic insulating layer 34 covers the wires 43, the inorganic insulating layers 31 and 32, and the protective layer 33. An organic insulating layer 35 is formed on the inorganic insulating layer 34, transparent conductive layers 44 are formed on the organic insulating layer 35, and an inorganic insulating layer 36 is formed on the transparent conductive layers 44. The inorganic insulating layer 34 has a side 34d under a side 35d of the organic insulating layer 35, and the side 34d forms a flush surface with the side 35d. The wires 43 and/or the transparent conductive layers 44 may not be formed.

Since the side 35d of the organic insulating layer 35 is covered with the inorganic insulating layer 36, entrance of moisture from the side 35d into the organic insulating layer 35 can be suppressed. Thus, peeling of the periphery of the terminal 20 can be suppressed.

The side 34d of the inorganic insulating layer 34 is placed under the side 35d of the organic insulating layer 35. The inorganic insulating layer 36 also covers the side 34d as well as the side 35d and thus can prevent exposure of the side 34d of the inorganic insulating layer 34 which is disadvantageous in terms of moisture-barrier properties. The inorganic insulating layer 36 which is in contact with the insulating substrate 30, particularly with the upper face 30e thereof, can also prevent exposure of the inorganic insulating layer 32 and the protective layer 33 both of which are disadvantageous in terms of moisture-barrier properties.

In contrast, the inorganic insulating layer 36 in Embodiment 1, which is advantageous in terms of moisture-barrier properties, does not cover the side of the inorganic insulating layer 34, which is disadvantageous in terms of moisture-barrier properties. As illustrated in FIG. 4(b), the inorganic insulating layer 36 does not cover the entire part of the protective layer 33 in the periphery of the terminal 20. Furthermore, a side of the inorganic insulating layer 32 which is disadvantageous in terms of moisture-barrier properties is exposed at the end face of the array substrate.

Thus, the present embodiment can suppress entrance of moisture into the organic insulating layer 35 more effectively than Embodiment 1.

The aforementioned coating structure may be formed in the periphery of an end face of the array substrate of the present embodiment. In this case, the end face of the array substrate of the present embodiment may include a side of a glass substrate as the insulating substrate 30, and may further include a side of a $SiO_2$ layer as the inorganic insulating film 36.

Also in a TFT portion of the array substrate of the present embodiment, the inorganic insulating layer 34 may have its side under the side of the organic insulating layer 35, and these sides may form a flush surface and may be covered with the inorganic insulating layer 36.

Figure 15:
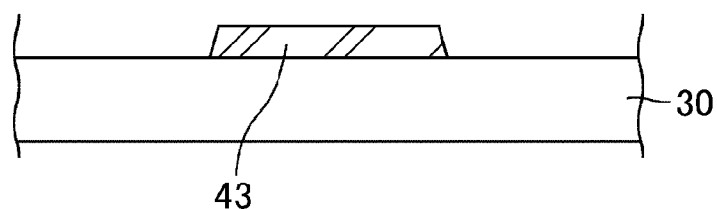
FIG. 15 is a schematic cross-sectional view of members in the production process (production step of a gate layer) of the array substrate of Embodiment 2, illustrating the periphery of a terminal.
Figure 16:
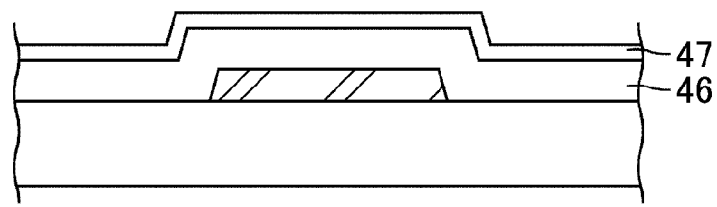
FIG. 16 is a schematic cross-sectional view of members in the production process (film production step of first and second insulating films) of the array substrate of Embodiment 2, illustrating the periphery of a terminal.
Figure 17:
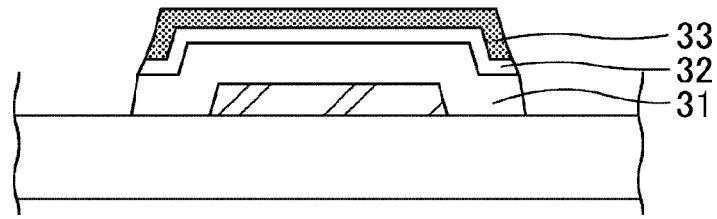
FIG. 17 is a schematic cross-sectional view of members in the production process (production step of inorganic insulating layers and a protective layer) of the array substrate of Embodiment 2, illustrating the periphery of a terminal.
Figure 18:
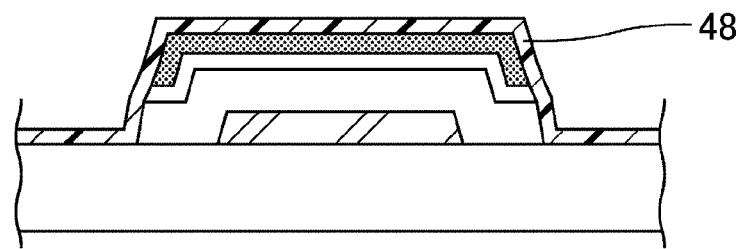
FIG. 18 is a schematic cross-sectional view of members in the production process (film production step of a fourth insulating film) of the array substrate of Embodiment 2, illustrating the periphery of a terminal.
Figure 19:
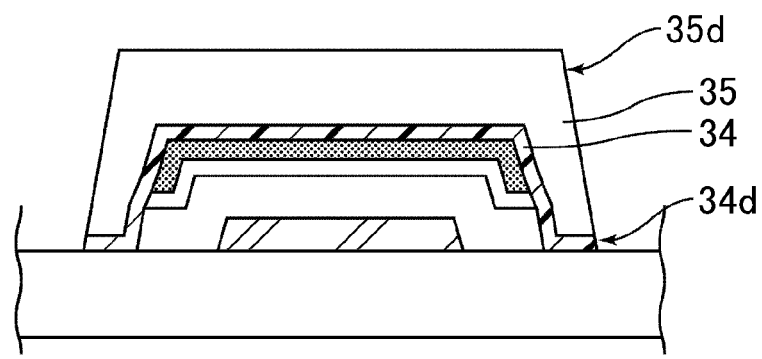
FIG. 19 is a schematic cross-sectional view of members in the production process (production step of an organic insulating layer) of the array substrate of Embodiment 2, illustrating the periphery of a terminal.
Figure 20:
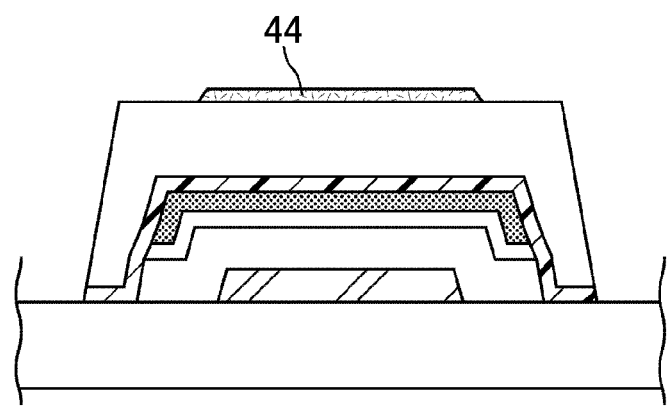
FIG. 20 is a schematic cross-sectional view of members in the production process (production step of a transparent conductive layer) of the array substrate of Embodiment 2, illustrating the periphery of a terminal.
Figure 21:
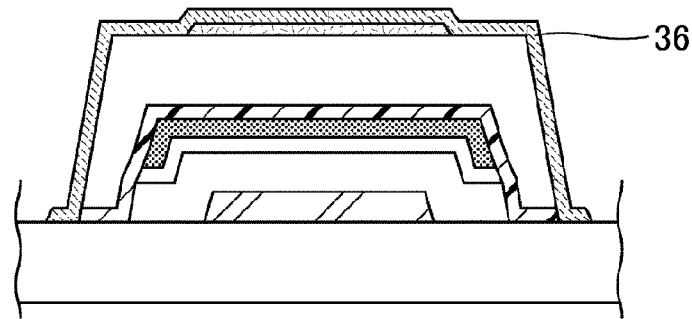
FIG. 21 is a schematic cross-sectional view of members in the production process (production step of an inorganic insulating layer) of the array substrate of Embodiment 2, illustrating the periphery of a terminal.

The method of producing the array substrate of the present embodiment is shown below. FIGS. 15 to 21 are schematic cross-sectional views of members in the production process of the array substrate of Embodiment 2, each illustrating the periphery of a terminal. FIG. 15 illustrates a forming process of a gate layer; FIG. 16 illustrates a film forming process of first and second insulating films; FIG. 17 illustrates a forming process of inorganic insulating layers and a protective layer; FIG. 18 illustrates a film forming process of a fourth insulating film; FIG. 19 illustrates a forming process of an organic insulating layer; FIG. 20 illustrates a forming process of a transparent conductive layer; and FIG. 21 illustrates a forming process of an inorganic insulating layer.

The following steps are performed in the same manner as in Embodiment 1. First, the insulating substrate 30 is prepared and a gate layer including the wires 43 is formed as illustrated in FIG. 15. Next, a first insulating film 46 and a second insulating film 47 are formed as illustrated in FIG. 16, and then semiconductor layers and a third insulating film are formed in this order. The first to third insulating film s are then patterned and formed into the inorganic insulating layers 31 and 32 and the protective layer 33 as illustrated in FIG. 17. Next, a source layer is formed. Subsequently, a fourth insulating film 48 is formed as illustrated in FIG. 18 and then annealed. Then, an organic insulating film is patterned and then annealed to form the organic insulating layer 35.

Next, the fourth insulating film 48 covered with the organic insulating layer 35 as a mask is subjected to dry etching. Thereby, the inorganic insulating layer 34 is formed as illustrated in FIG. 19. A side 35d of the organic insulating layer 35 forms a flush surface with a side 34d of the inorganic insulating layer 34.

Subsequently, the transparent conductive layers 44 are formed as illustrated in FIG. 20 in the same manner as in Embodiment 1.

Then, a fifth insulating film (passivation film) for the inorganic insulating layer 36 is formed by CVD on the entire surface of the substrate including the transparent conductive layers 44. A sixth resist is formed on the fifth insulating film by photolithography. The fifth insulating film covered with the sixth resist as a mask is subjected to dry etching, and the sixth resist is then removed. Thereby, the inorganic insulating layer 36 is formed as illustrated in FIG. 21.

Subsequently, a second transparent conductive film is patterned and then annealed in the same manner as in Embodiment 1. Thus, the array substrate of the present embodiment is completed.

(Embodiment 3)

The present embodiment is substantially the same as Embodiment 1 except that the coating structure of the inorganic insulating layers and the production process of the array substrate are different. Thus, the features unique to the present embodiment are mainly described, and the descriptions redundant with Embodiment 1 are omitted. Members (including regions and sections) having the function the same as or similar to those of Embodiment 1 are given the same symbols as in Embodiment 1, and the descriptions of the members are omitted.

Figure 22:
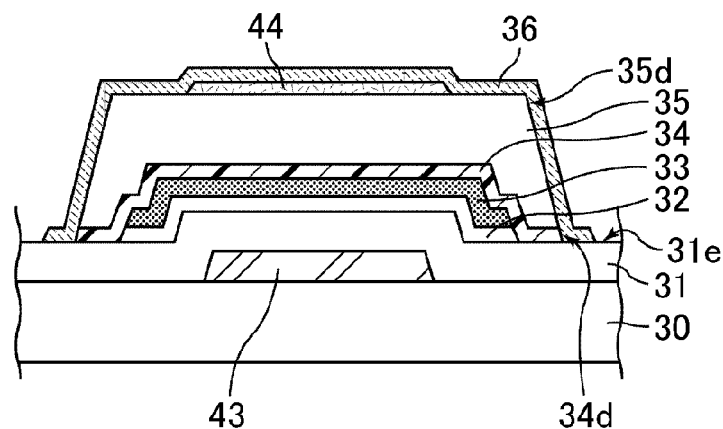
FIG. 22 is a schematic cross-sectional view of the array substrate of Embodiment 3, illustrating the periphery of a terminal.

Referring to FIG. 3 and FIG. 22, the structure of the periphery of a terminal of the present embodiment is described. FIG. 22 is a schematic cross-sectional view of the array substrate of Embodiment 3, illustrating the periphery of a terminal.

As illustrated in FIGS. 3 and 22, wires 43 are formed on an insulating substrate 30 in a peripheral region 25, particularly in the periphery of a terminal 20 (e.g. the portion surrounded by the dashed circle in FIG. 3). The wires 43 are covered with an inorganic insulating layer 31. An inorganic insulating layer 32 and a protective layer 33 are stacked in this order on the inorganic insulating layer 31. An inorganic insulating layer 34 covers the inorganic insulating layer 32 and the protective layer 33. An organic insulating layer 35 is formed on the inorganic insulating layer 34, transparent conductive layers 44 are formed on the organic insulating layer 35, and an inorganic insulating layer 36 is formed on the transparent conductive layers 44. The inorganic insulating layer 34 has a side 34d under a side 35d of the organic insulating layer 35, and the side 34d forms a flush surface with the side 35d. The wires 43 and/or the transparent conductive layers 44 may not be formed.

Since the side 35d of the organic insulating layer 35 is covered with the inorganic insulating layer 36, entrance of moisture from the side 35d into the organic insulating layer 35 can be suppressed. Thus, peeling of the periphery of the terminal 20 can be suppressed.

The side 34d of the inorganic insulating layer 34 is placed under the side 35d of the organic insulating layer 35. The inorganic insulating layer 36 also covers the side 34d as well as the side 35d, and thus can prevent exposure of the side 34d of the inorganic insulating layer 34, which is disadvantageous in terms of moisture-barrier properties. The inorganic insulating layer 31 which is advantageous in terms of moisture-barrier properties is formed between the insulating substrate 30 and the inorganic insulating layer 34, and partly protrudes from the inorganic insulating layer 34. An upper face 31e of this protruding part is in contact with the inorganic insulating layer 36. This can prevent exposure of the inorganic insulating layer 32 and the protective layer 33, both of which are disadvantageous in terms of moisture-barrier properties.

In contrast, the inorganic insulating layer 36 in Embodiment 1, which is advantageous in terms of moisture-barrier properties, does not cover the side of the inorganic insulating layer 34, which is disadvantageous in terms of moisture-barrier properties. As illustrated in FIG. 4(b), the inorganic insulating layer 36 does not cover the entire part of the protective layer 33 in the periphery of the terminal 20. Furthermore, a side of the inorganic insulating layer 32, which is disadvantageous in terms of moisture-barrier properties, is exposed at the end face of the array substrate.

Thus, the present embodiment can suppress entrance of moisture into the organic insulating layer 35 more effectively than Embodiment 1.

The aforementioned coating structure may be employed in the periphery of an end face of the array substrate of the present embodiment. In this case, the end face of the array substrate of the present embodiment may include a side of a glass substrate as the insulating substrate 30 and a side of a SiNx layer as the inorganic insulating layer 31, and may further include a side of a SiO$_2$ layer as the inorganic insulating film 36.

Also in a TFT portion of the array substrate of the present embodiment, the inorganic insulating layer 34 may have its side under the side of the organic insulating layer 35, and these sides may form a flush surface and may be covered with the inorganic insulating layer 36.

Figure 23:
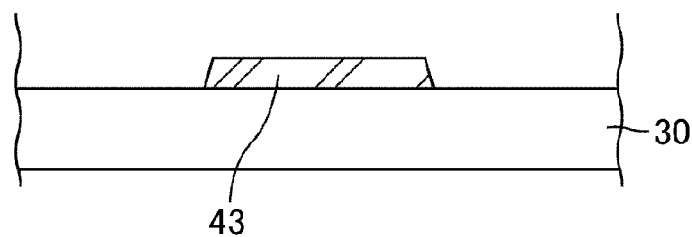
FIG. 23 is a schematic cross-sectional view of members in the production process (production step of a gate layer) of the array substrate of Embodiment 3, illustrating the periphery of a terminal.
Figure 24:
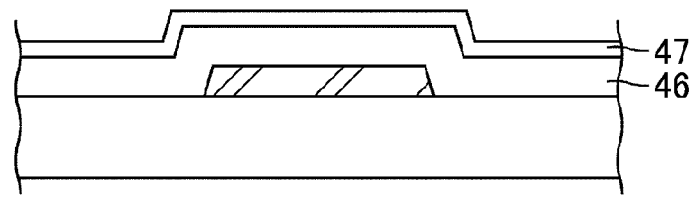
FIG. 24 is a schematic cross-sectional view of members in the production process (film production step of first and second insulating films) of the array substrate of Embodiment 3, illustrating the periphery of a terminal.
Figure 25:
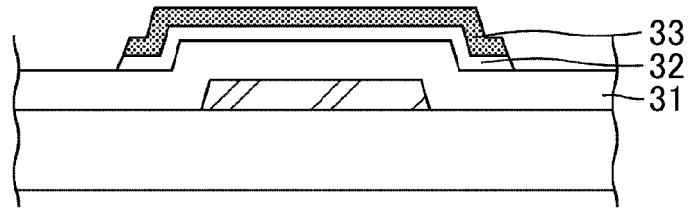
FIG. 25 is a schematic cross-sectional view of members in the production process (production step of an inorganic insulating layer and a protective layer) of the array substrate of Embodiment 3, illustrating the periphery of a terminal.
Figure 26:
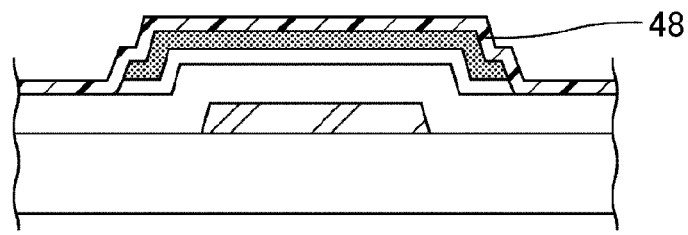
FIG. 26 is a schematic cross-sectional view of members in the production process (film production step of a fourth insulating film) of the array substrate of Embodiment 3, illustrating the periphery of a terminal.
Figure 27:
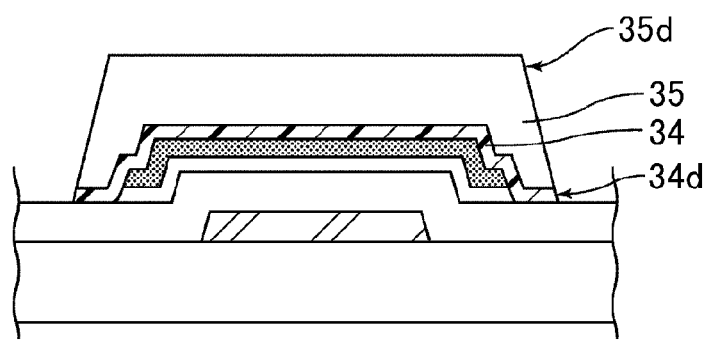
FIG. 27 is a schematic cross-sectional view of members in the production process (production step of an organic insulating layer) of the array substrate of Embodiment 3, illustrating the periphery of a terminal.
Figure 28:
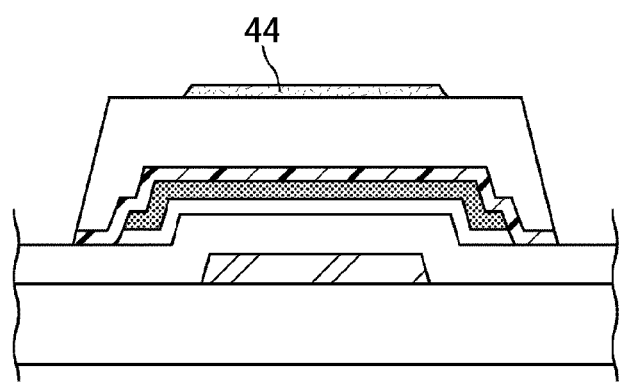
FIG. 28 is a schematic cross-sectional view of members in the production process (production step of a transparent conductive layer) of the array substrate of Embodiment 3, illustrating the periphery of a terminal.
Figure 29:
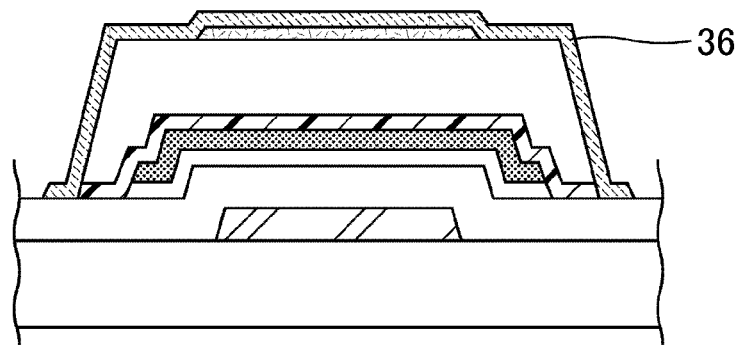
FIG. 29 is a schematic cross-sectional view of members in the production process (production step of an inorganic insulating layer) of the array substrate of Embodiment 3, illustrating the periphery of a terminal.
Figure 30:
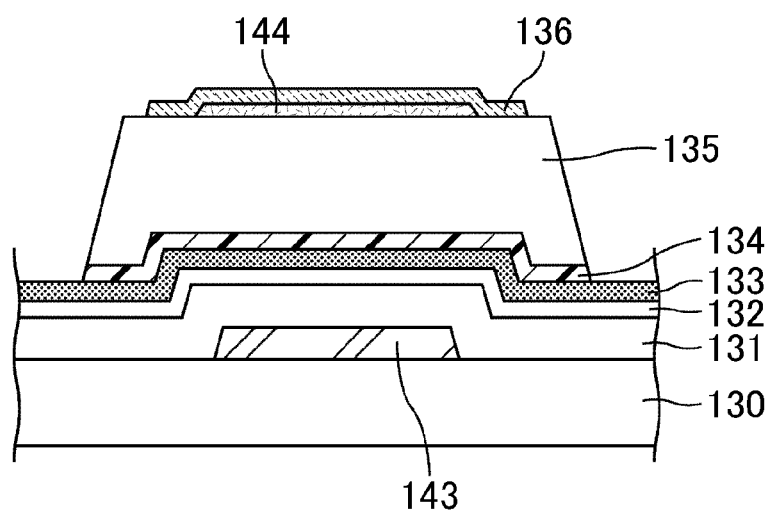
FIG. 30 is a schematic cross-sectional view of the array substrate of the liquid crystal display panel of Comparative Embodiment 1, illustrating the periphery of a terminal.

The method of producing the array substrate of the present embodiment is shown below. FIGS. 23 to 29 are schematic cross-sectional views of members in the production process of the array substrate of Embodiment 3, each illustrating the periphery of a terminal. FIG. 23 illustrates a forming process of a gate layer; FIG. 24 illustrates a film forming process of first and second insulating films; FIG. 25 illustrates a forming process of an inorganic insulating layer and a protective layer; FIG. 26 illustrates a film forming process of a fourth insulating film; FIG. 27 illustrates a forming process of an organic insulating layer; FIG. 28 illustrates a forming process of a transparent conductive layer; and FIG. 29 illustrates a forming process of an inorganic insulating layer.

The following steps are performed in the same manner as in Embodiment 1. First, the insulating substrate 30 is prepared, and a gate layer including the wires 43 is formed as illustrated in FIG. 23. Next, a first insulating film 46 and a second insulating film 47 are formed as illustrated in FIG. 24. Then, semiconductor layers and a third insulating film are formed in this order.

Subsequently, a resist is formed on the third insulating film by photolithography. The second and third insulating films covered with the resist as a mask are subjected to dry etching together, and the resist is then removed. Thereby, the inorganic insulating layer 32 and the protective layer 33 are formed as illustrated in FIG. 25. At this stage, the first insulating film is not etched.

Next, an additional insulating film is optionally formed. Then, formation of a resist, dry etching of the first insulating film (and the additional insulating film), and removal of the resist are performed in this order. Thereby, the inorganic insulating layer 31 is formed. As illustrated in FIG. 22, in the periphery of the terminal 20, the first insulating film is not removed and is present as the inorganic insulating layer 31.

Next, a source layer is formed. Subsequently, a fourth insulating film 48 is formed as illustrated in FIG. 26 and then annealed. Then, an organic insulating film is patterned and then annealed to form the organic insulating layer 35. These steps may be performed in the same manner as in Embodiment 1.

Next, the fourth insulating film 48 covered with the organic insulating layer 35 as a mask is subjected to dry etching. Thereby, the inorganic insulating layer 34 is formed as illustrated in FIG. 27. A side 35d of the organic insulating layer 35 forms a flush surface with a side 34d of the inorganic insulating layer 34.

Subsequently, the transparent conductive layers 44 are formed as illustrated in FIG. 28 in the same manner as in Embodiment 1.

Then, a fifth insulating film (passivation film) for the inorganic insulating layer 36 is formed by CVD on the entire surface of the substrate including the transparent conductive layers 44. A resist is formed on the fifth insulating film by photolithography. The fifth insulating film covered with the resist as a mask is subjected to dry etching, and the resist is then removed. Thereby, the inorganic insulating layer 36 is formed as illustrated in FIG. 29.

Subsequently, a second transparent conductive film is patterned and then annealed in the same manner as in Embodiment 1. Thus, the array substrate of the present embodiment is completed.

As mentioned above, Embodiments 1 to 3 are described under the assumption that the TFTs are bottom gate type TFTs in each of which a gate electrode is disposed between an insulating substrate and a semiconductor layer. The type of the TFTs is not limited to the bottom gate type and may be any appropriate type in each embodiment. For example, planar type TFTs may be used. A planar type TFT includes a semiconductor layer disposed between an insulating substrate and a gate electrode, and a source electrode and a drain electrode disposed on the gate electrode via an interlayer insulating film.

The liquid crystal display of each embodiment may be a monochrome liquid crystal display. In this case, each pixel does not need to be divided into multiple sub pixels.

Although each embodiment mainly focuses on a liquid crystal display, the kind of the display device of the present invention is not particularly limited to liquid crystal displays. Examples of the display device include electronic paper displays using a microcapsule electrophoretic system and organic or inorganic EL displays.

Although liquid crystal displays described in Embodiments 1 to 3 are FFS mode displays, the display mode of the liquid crystal display in each embodiment is not limited and may be any appropriate mode. Examples of the display mode include twisted nematic (TN) mode, multi-domain vertical alignment (MVA) mode, in-plane switching (IPS) mode using common and pixel electrodes each having a comb structure, and transverse bend alignment (TBA) mode. A liquid crystal layer of a TBA mode display includes nematic liquid crystal molecules having negative dielectric anisotropy. The liquid crystal molecules form a vertical alignment when no voltage is applied. The array substrate of the TBA mode liquid crystal display includes a pair of electrodes (e.g. a common electrode and a pixel electrode each having a comb structure). The liquid crystal molecules form a bend alignment under a transverse electric field generated between the electrodes. Preferred display modes of the liquid crystal display include a display mode in which an array substrate includes a transparent common electrode, a transparent pixel electrode, and a dielectric between these electrodes (hereinafter, such a structure is also referred to as a transparent Cs structure), and these members form a storage capacitance. Examples of such a display mode include continuous pinwheel alignment (CPA) mode including a transparent Cs structure. A CPA mode liquid crystal display including a transparent Cs structure includes a liquid crystal layer including nematic liquid crystal molecules having negative dielectric anisotropy. In this display, the liquid crystal molecules are vertically aligned when no voltage is applied; the array substrate includes a transparent common electrode, an interlayer insulating film on the common electrode, and a transparent pixel electrode on the interlayer insulating film; and the counter substrate includes a transparent common electrode facing to the pixel electrode and dot-like protrusions (rivets) on the common electrode. The liquid crystal molecules are radially aligned around each protrusion under a vertical electric field generated between the pixel electrode and the common electrode. The dot-like protrusions (rivets) may be replaced with circular, cross, polygonal or the like apertures on the common electrode, thereby achieving a radial alignment of liquid crystal molecules around each aperture.

Although Embodiments 1 to 3 describe transmissive liquid crystal displays, the liquid crystal panel of each liquid crystal display may include a reflective display section that displays an image by reflecting external light.

The aforementioned embodiments may be employed in appropriate combination as long as the combination is not beyond the spirit of the present invention. Variations of each embodiment may be employed in appropriate combination with other embodiments.

REFERENCE SIGNS LIST

1: Liquid crystal display
10: Liquid crystal panel
11: Array substrate
11a: End face
12: Color filter substrate (CF substrate)
13: Liquid crystal layer
14: Seal
15: Display section
16: Protruding region
17 to 19, 52: Wire
20 to 23: Terminal
24: Display region
25: Peripheral region
26: Pixel
30: Insulating substrate
30e, 31e, 34c, 34e, 34g: Upper face
31, 32, 34, 36: Inorganic insulating layer
33: Protective layer
34d, 35b, 35d, 34f, 35f: Side
34a, 35a, 36a: Aperture
35: Organic insulating layer
37: Gate electrode
38: Semiconductor layer
39: Source electrode
40: Drain electrode
41, 42, 44: Transparent conductive layer
43, 45: Wiring
46: First insulating film
47: Second insulating film
48: Fourth insulating film
49: TFT 50: Flexible wiring substrate (FPC substrate)
51: Insulating film
53: IC chip
54: Bump
55, 58: Thermosetting resin
56, 59: Conductive particle
57, 60: Anisotropic conductive member

The invention claimed is:

1. A thin film transistor substrate comprising:
an insulating substrate;
a thin film transistor;
a first inorganic insulating layer;
an organic insulating layer stacked on the first inorganic insulating layer;
a second inorganic insulating layer stacked on the organic insulating layer;
a display region in which multiple pixel regions are arranged;
a first transparent conductive layer; and
a second transparent conductive layer, wherein
the organic insulating layer including a side covered with the second inorganic insulating layer;
the side of the organic insulating layer is placed in the display region;
the thin film transistor includes a drain electrode;
the first inorganic insulating layer is stacked on the drain electrode;
the first transparent conductive layer is stacked on the organic insulating layer;
the second transparent conductive layer is stacked on the second inorganic insulating layer;
the organic insulating layer is provided with an aperture;
the side of the organic insulating layer surrounds the aperture;
the first and second inorganic insulating layers are each provided with an aperture in the aperture of the organic insulating layer; and
the second transparent conductive layer is connected to the drain electrode through the apertures of the first and second inorganic insulating layers.

2. The thin film transistor substrate according to claim 1, further comprising:
a peripheral region surrounding the display region,
wherein the side of the organic insulating layer is placed in the peripheral region.

3. The thin film transistor substrate according to claim 2, further comprising a terminal on the insulating substrate,
wherein the side of the organic insulating layer is placed in a periphery of the terminal.

4. The thin film transistor substrate according to claim 2,
wherein the side of the organic insulating layer is placed in a periphery of an end face of the thin film transistor substrate.

5. The thin film transistor substrate according to claim 1,
wherein the first inorganic insulating layer includes a part protruding from the organic insulating layer, and
the second inorganic insulating layer is in contact with an upper face of the part protruding from the organic insulating layer.

6. The thin film transistor substrate according to claim 1,
wherein the first inorganic insulating layer contains silicon oxide, and
the organic insulating layer contains photosensitive resin.

7. The thin film transistor substrate according to claim 1,
wherein the second inorganic insulating layer contains silicon nitride.

8. The thin film transistor substrate according to claim 1,
wherein the thin film transistor comprises a semiconductor layer containing a metal oxide, and
the metal oxide contains oxygen and at least one element selected from the group consisting of indium, gallium, aluminum, copper, zinc, magnesium, and cadmium.

9. The thin film transistor substrate according to claim 8,
wherein the metal oxide contains indium, gallium, zinc, and oxygen.

10. A display device comprising the thin film transistor substrate according to claim 1.

* * * * *